US012700457B2

(12) United States Patent
Li et al.

(10) Patent No.: US 12,700,457 B2
(45) Date of Patent: Aug. 4, 2026

(54) MEMORY DEVICE AND PROGRAM OPERATION THEREOF

(71) Applicant: YANGTZE MEMORY TECHNOLOGIES CO., LTD., Wuhan (CN)

(72) Inventors: Kaiwei Li, Wuhan (CN); Kaikai You, Wuhan (CN); Junbao Wang, Wuhan (CN); Jianquan Jia, Wuhan (CN); Wenhao Xiong, Wuhan (CN); Xiangnan Zhao, Wuhan (CN); Songmin Jiang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 122 days.

(21) Appl. No.: 18/909,360

(22) Filed: Oct. 8, 2024

(65) Prior Publication Data

US 2026/0094647 A1 Apr. 2, 2026

(30) Foreign Application Priority Data

Sep. 27, 2024 (CN) .......................... 202411371012.5

(51) Int. Cl.
| | |
|---|---|
| *G11C 16/26* | (2006.01) |
| *G11C 16/04* | (2006.01) |
| *G11C 16/08* | (2006.01) |
| *G11C 16/10* | (2006.01) |
| *G11C 16/34* | (2006.01) |
| *H10B 43/10* | (2023.01) |
| *H10B 43/35* | (2023.01) |

(52) U.S. Cl.
CPC .......... *G11C 16/10* (2013.01); *G11C 16/0483* (2013.01); *G11C 16/08* (2013.01); *G11C 16/26* (2013.01); *G11C 16/3459* (2013.01); *H10B 43/10* (2023.02); *H10B 43/35* (2023.02)

(58) Field of Classification Search
CPC ..... G11C 16/10; G11C 16/0483; G11C 16/08; G11C 16/3459; G11C 16/26; H10B 43/10; H10B 43/35
USPC ........................................ 365/185.17, 185.24
See application file for complete search history.

(56) References Cited

U.S. PATENT DOCUMENTS

| | | | | |
|---|---|---|---|---|
| 2016/0071599 A1* | 3/2016 | Hsu ........................ | G11C 16/32 |
| | | | 365/185.12 |
| 2019/0214395 A1* | 7/2019 | Zhang .................... | H10B 43/20 |
| 2020/0090772 A1* | 3/2020 | Maeda ................... | H10B 43/27 |
| 2021/0391024 A1* | 12/2021 | Chen ................. | G11C 16/3459 |
| 2021/0391348 A1* | 12/2021 | Han ........................ | H10B 41/27 |

\* cited by examiner

*Primary Examiner* — Michael T Tran
(74) *Attorney, Agent, or Firm* — BAYES PLLC

(57) ABSTRACT

In certain aspects, a memory device includes memory strings each including a first drain select gate (DSG) transistor, an insulating structure disposed between two adjacent sets of the memory strings and electrically separating the first DSG transistors of the two adjacent sets of the memory strings, first DSG line, each coupled to the first DSG transistors in a respective set of the two adjacent sets of the memory strings, and a peripheral circuit coupled to the memory strings through the first DSG lines and configured to, in an operation, apply a negative voltage to an unselect first DSG line of the first DSG lines, wherein the unselect first DSG line is coupled to the first DSG transistors in an unselect set of the two adjacent sets of the memory strings.

20 Claims, 18 Drawing Sheets

101

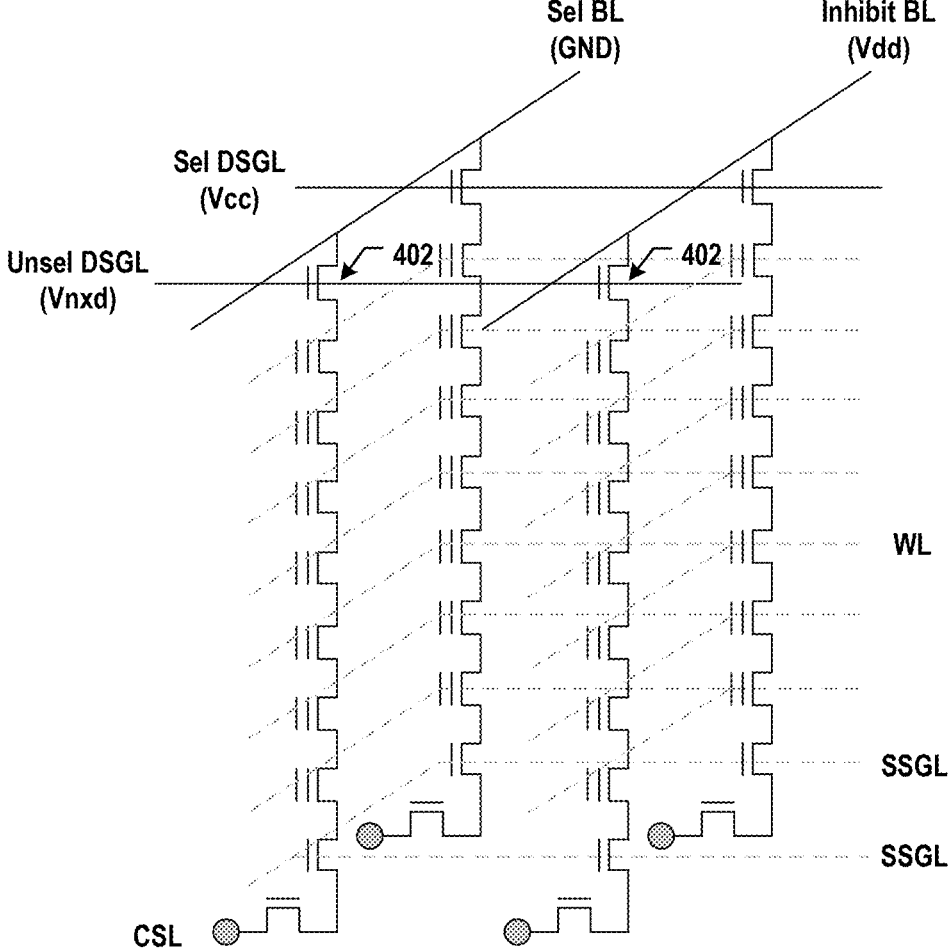
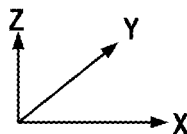
FIG. 4

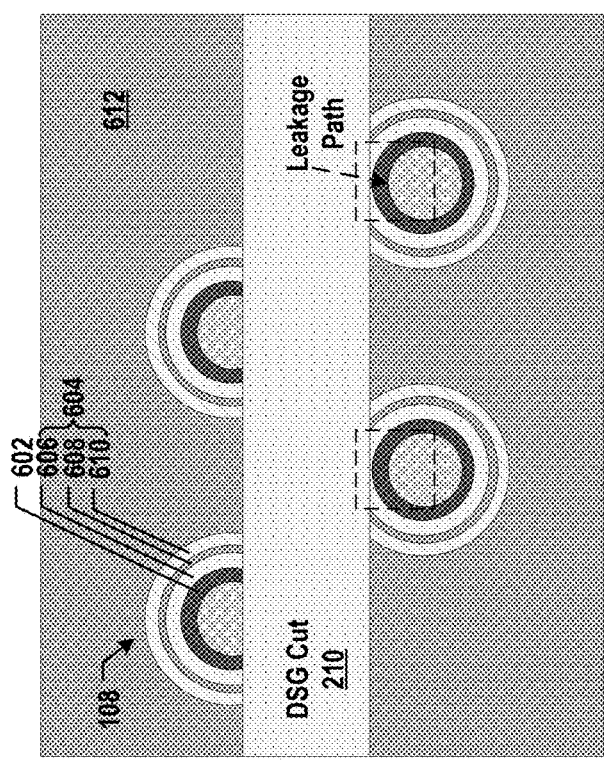
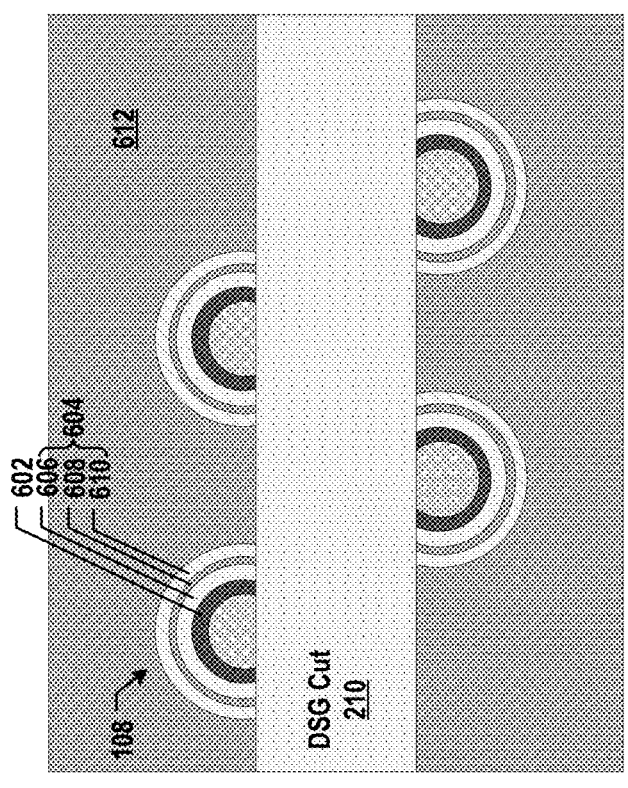
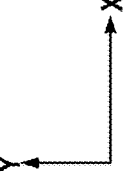
FIG. 6

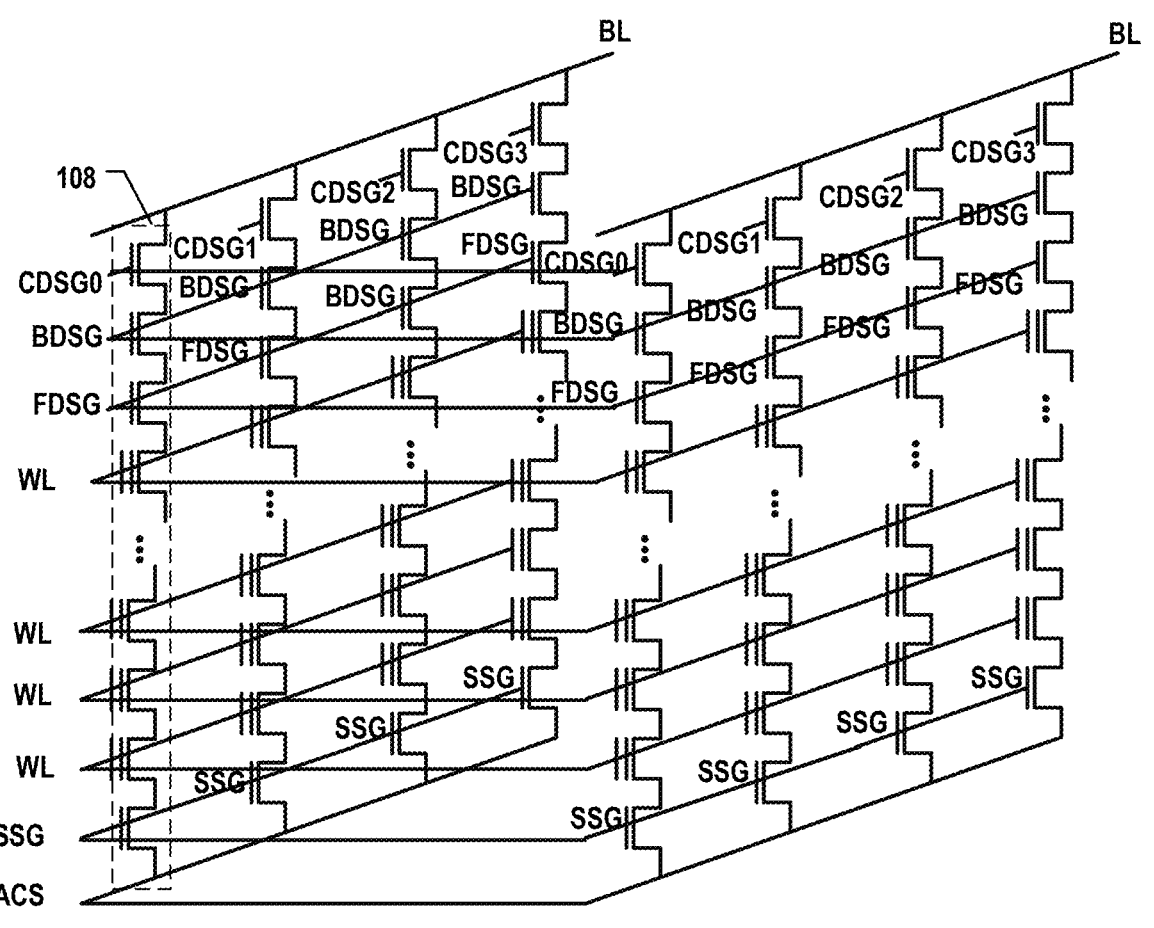
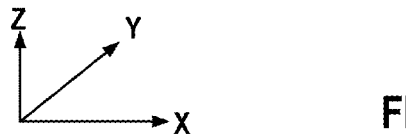
FIG. 7B

1400

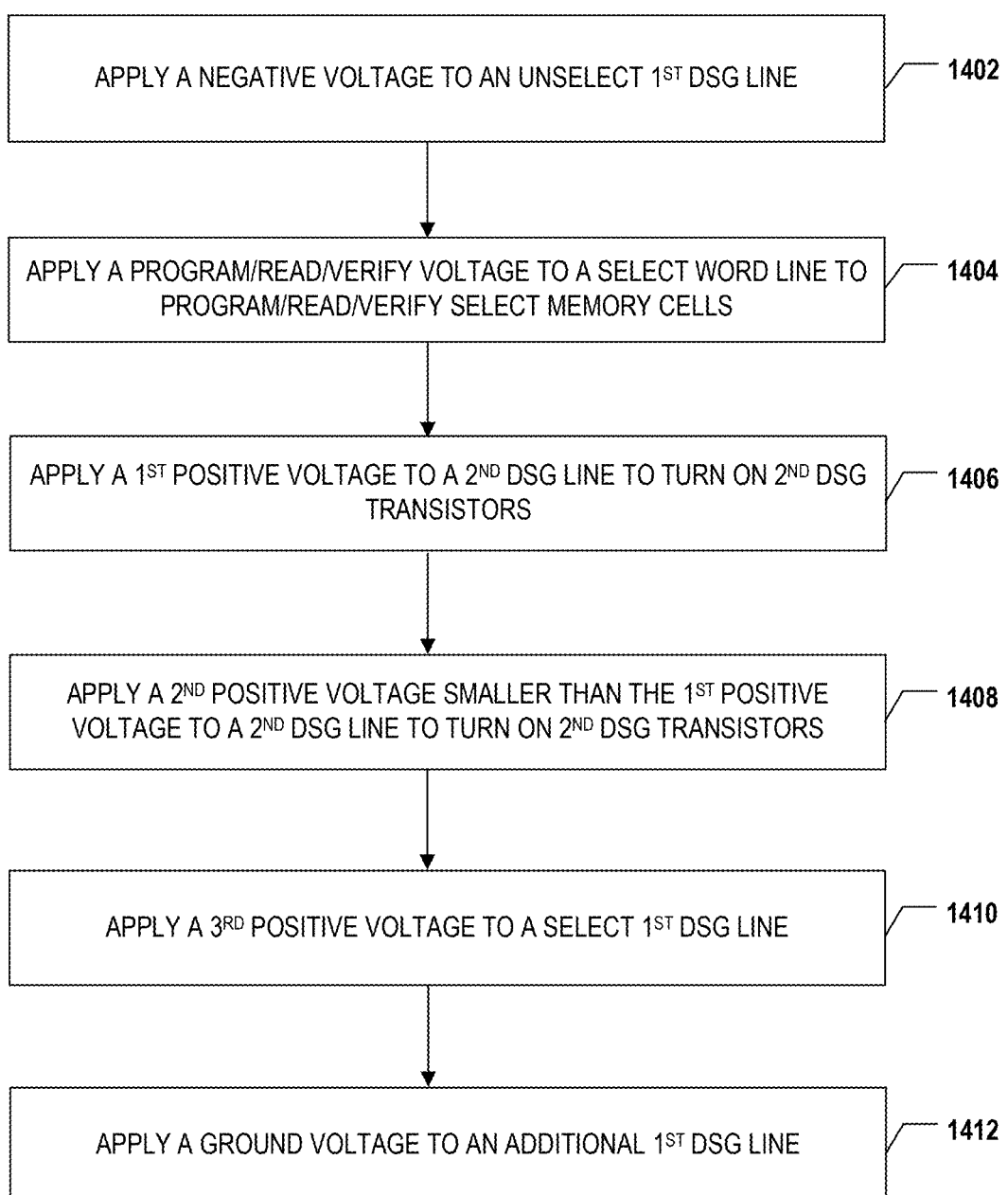

APPLY A NEGATIVE VOLTAGE TO AN UNSELECT 1ST DSG LINE — 1402

APPLY A PROGRAM/READ/VERIFY VOLTAGE TO A SELECT WORD LINE TO PROGRAM/READ/VERIFY SELECT MEMORY CELLS — 1404

APPLY A 1ST POSITIVE VOLTAGE TO A 2ND DSG LINE TO TURN ON 2ND DSG TRANSISTORS — 1406

APPLY A 2ND POSITIVE VOLTAGE SMALLER THAN THE 1ST POSITIVE VOLTAGE TO A 2ND DSG LINE TO TURN ON 2ND DSG TRANSISTORS — 1408

APPLY A 3RD POSITIVE VOLTAGE TO A SELECT 1ST DSG LINE — 1410

APPLY A GROUND VOLTAGE TO AN ADDITIONAL 1ST DSG LINE — 1412

FIG. 14

MEMORY DEVICE AND PROGRAM OPERATION THEREOF

CROSS-REFERENCE TO RELATED APPLICATIONS

This application claims the benefit of priority to Chinese Application No. 202411371012.5, filed on Sep. 27, 2024, which is incorporated herein by reference in its entirety.

BACKGROUND

The present disclosure relates to memory devices and operation methods thereof.

Flash memory is a low-cost, high-density, non-volatile solid-state storage medium that can be electrically erased and reprogrammed. Flash memory includes NOR Flash memory and NAND Flash memory. Various operations can be performed by Flash memory, such as read, program (write), and erase. For NAND Flash memory, an erase operation can be performed at the block level, and a program operation or a read operation can be performed at the page level.

SUMMARY

In one aspect, a memory device includes memory strings each including a first drain select gate (DSG) transistor, an insulating structure disposed between two adjacent sets of the memory strings and electrically separating the first DSG transistors of the two adjacent sets of the memory strings, first DSG line, each coupled to the first DSG transistors in a respective set of the two adjacent sets of the memory strings, and a peripheral circuit coupled to the memory strings through the first DSG lines and configured to, in an operation, apply a negative voltage to an unselect first DSG line of the first DSG lines, wherein the unselect first DSG line is coupled to the first DSG transistors in an unselect set of the two adjacent sets of the memory strings.

In some implementations, the insulating structure extends laterally in a straight line or a serpentine line, and extends vertically through the first DSG lines.

In some implementations, each of the memory strings further includes memory cells, and the memory device further includes word lines coupled to the memory cells of the memory strings. In some implementations, the operation includes a program operation, and the peripheral circuit is further configured to, in the program operation, during applying the negative voltage to the unselect first DSG line, apply a program voltage to a select word line of the word lines to program select memory cells of the memory cells that are coupled to the select word line.

In some implementations, each of the memory strings further includes memory cells, and the memory device further includes word lines coupled to the memory cells of the memory strings. In some implementations, the operation includes a read operation or a verify operation, and the peripheral circuit is further configured to, in the read or verify operation, during applying the negative voltage to the unselect first DSG line, apply a read/verify voltage to a select word line of the word lines to read or verify select memory cells of the memory cells coupled to the select word line.

In some implementations, each of the memory strings further includes a second DSG transistor, and the memory device further includes a second DSG line coupled to the second DSG transistors of the memory strings. In some implementations, the peripheral circuit is further configured to, during applying the negative voltage to the unselect first DSG line, apply a first positive voltage to the second DSG line to turn on the second DSG transistors.

In some implementations, each of the memory strings further includes a third DSG transistor, the memory device further includes a third DSG line coupled to the third DSG transistors of the memory strings, and the third DSG line is vertically closer to the insulating structure than the second DSG line. In some implementations, the peripheral circuit is further configured to, during applying the negative voltage to the unselect first DSG line, apply a second positive voltage smaller than the first positive voltage to the third DSG line to turn on the third DSG transistors.

In some implementations, the insulating structure extends vertically through the first DSG lines and stops before reaching the second DSG line.

In some implementations, the peripheral circuit is further configured to, in the operation, apply a third positive voltage to a select first DSG line of the first DSG lines, the select first DSG line being coupled to the first DSG transistors in a select set of the two adjacent sets of the memory strings.

In some implementations, the memory device further includes an additional first DSG line coupled to the first DSG transistors in an additional unselect set of the memory strings that is nonadjacent to the select set of the two adjacent sets of the memory strings. In some implementations, the peripheral circuit is further configured to, in the operation, apply a ground voltage to the additional first DSG line.

In some implementations, the memory device is a NAND Flash memory device.

In another aspect, a method for operating a memory device is provided. The memory device includes memory strings each including a first DSG transistor, an insulating structure disposed between two adjacent sets of the memory strings and electrically separating the first DSG transistors of the two adjacent sets of the memory strings, and first DSG lines each coupled to the first DSG transistors in a respective set of the two adjacent sets of the memory strings. In an operation, a negative voltage is applied to an unselect first DSG line of the first DSG lines. The unselect first DSG line is coupled to the first DSG transistors in an unselect set of the two adjacent sets of the memory strings.

In some implementations, the insulating structure extends laterally in a straight line or a serpentine line, and extends vertically through the first DSG lines.

In some implementations, each of the memory strings further includes memory cells, and the memory device further includes word lines coupled to the memory cells of the memory strings. In some implementations, the operation includes a program operation, and in the program operation, during applying the negative voltage to the unselect first DSG line, a program voltage is applied to a select word line of the word lines to program select memory cells of the memory cells that are coupled to the select word line.

In some implementations, each of the memory strings further includes memory cells, and the memory device further includes word lines coupled to the memory cells of the memory strings. In some implementations, the operation includes a read operation or a verify operation, and in the read or verify operation, during applying the negative voltage to the unselect first DSG line, a read/verify voltage is applied to a select word line of the word lines to read or verify select memory cells of the memory cells coupled to the select word line.

In some implementations, each of the memory strings further includes a second DSG transistor, and the memory device further includes a second DSG line coupled to the second DSG transistors of the memory strings. In some implementations, during applying the negative voltage to the unselect first DSG line, a first positive voltage is applied to the second DSG line to turn on the second DSG transistors.

In some implementations, each of the memory strings further includes a third DSG transistor, the memory device further includes a third DSG line coupled to the third DSG transistors of the memory strings, and the third DSG line is vertically closer to the insulating structure than the second DSG line. In some implementations, during applying the negative voltage to the unselect first DSG line, a second positive voltage smaller than the first positive voltage is applied to the third DSG line to turn on the third DSG transistors.

In some implementations, the insulating structure extends vertically through the first DSG lines and stops before reaching the second DSG line.

In some implementations, in the operation, a third positive voltage is applied to a select first DSG line of the first DSG lines, the select first DSG line being coupled to the first DSG transistors in a select set of the two adjacent sets of the memory strings.

In some implementations, the memory device further includes an additional first DSG line coupled to the first DSG transistors in an additional unselect set of the memory strings that is nonadjacent to the select set of the two adjacent sets of the memory strings. In some implementations, in the operation, a ground voltage is applied to the additional first DSG line.

In still another aspect, a system includes a memory device configured to store data, and a memory controller coupled to the memory device and configured to control the memory device. The memory device includes memory strings each including a first DSG transistor, an insulating structure disposed between two adjacent sets of the memory strings and electrically separating the first DSG transistors of the two adjacent sets of the memory strings, first DSG line, each coupled to the first DSG transistors in a respective set of the two adjacent sets of the memory strings, and a peripheral circuit coupled to the memory strings through the first DSG lines and configured to, in an operation, apply a negative voltage to an unselect first DSG line of the first DSG lines, wherein the unselect first DSG line is coupled to the first DSG transistors in an unselect set of the two adjacent sets of the memory strings.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIG. 4 illustrates a schematic diagram of NAND memory strings, according to some aspects of the present disclosure.

FIG. 6 illustrates a plan view of NAND memory strings and DSG cuts, according to some aspects of the present disclosure.

FIG. 7B illustrates a perspective view of memory cell array including NAND memory strings and various types of DSG transistors, according to some aspects of the present disclosure.

FIG. 14 illustrates a flowchart of a method for operating a memory device, according to some aspects of the present disclosure.

Figure 1:
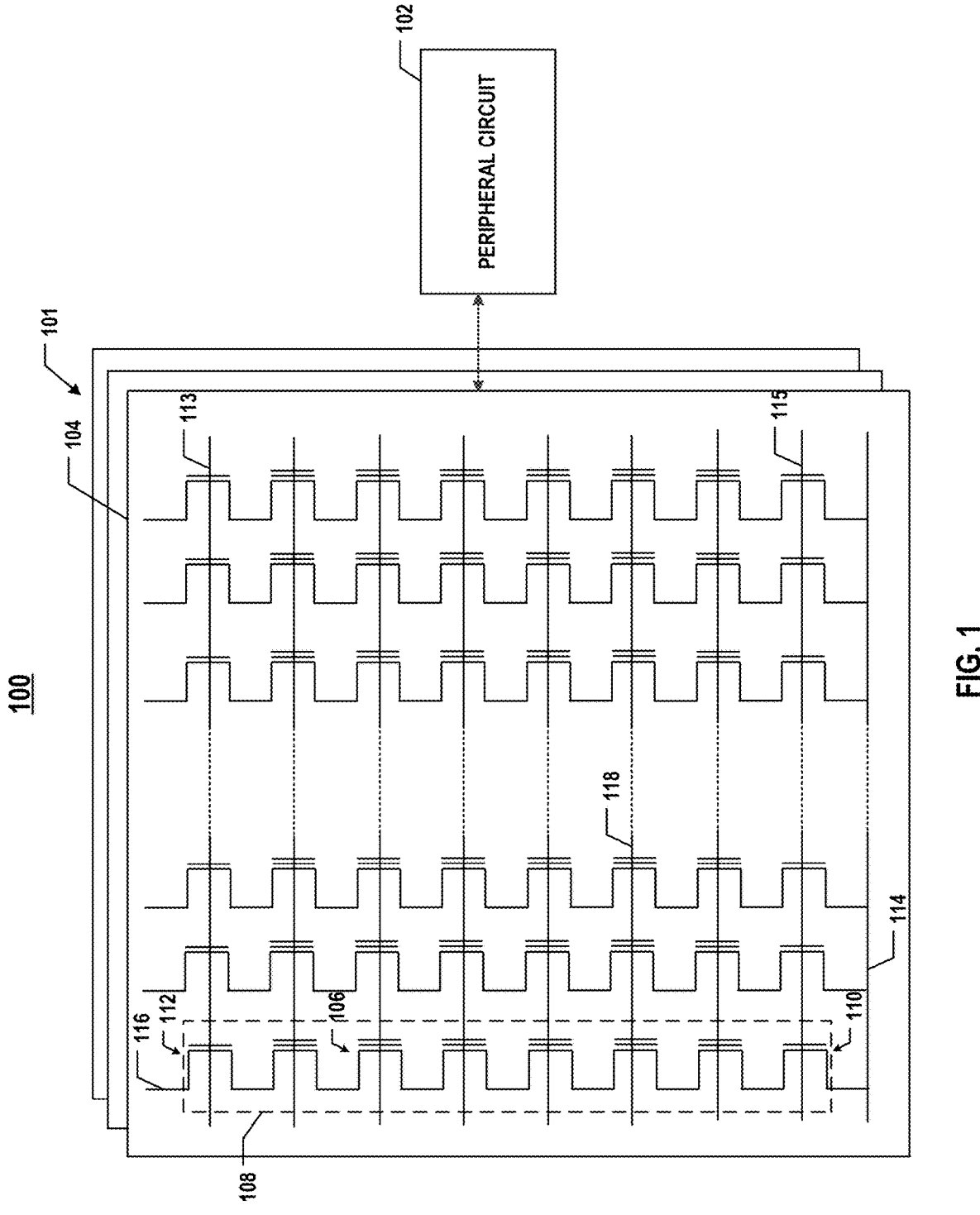
FIG. 1 illustrates a schematic diagram of a memory device including peripheral circuits, according to some aspects of the present disclosure.

The present disclosure will be described with reference to the accompanying drawings.

DETAILED DESCRIPTION

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Memory strings in NAND Flash memory devices (e.g., three-dimensional (3D) NAND memory strings) can be divided into different sets in the bit line direction (a.k.a. the y-direction), which can be individually controlled in an operation (e.g., a program or read/verify operation), using structures known as "DSG cuts." In order to increase the storage density, DSG cuts may be placed between two rows of memory strings. However, due to process variation in forming the DSG cuts, in some memory strings, the gate structure corresponding to part of the semiconductor channel may be removed by a DSG cut, thereby causing current leakage between the corresponding DSG transistor and bit line for the unselect sets of memory strings during an operation (e.g., a program or read/verify operation). The current leakage issue for an unselect set of memory strings can be worsened by the potential coupling from the adjacent select set of memory strings during an operation (e.g., a program operation). The current leakage between DSG transistor and bit line can impact the performance of the memory devices by introducing, for example, program disturbance in program operations and noise in read/verify operations.

To address one or more of the aforementioned issues, the present disclosure improves various operations, e.g., program operations and read/verify operations, by applying a negative voltage, instead of a ground voltage, to the DSG transistors of memory strings in an unselect set of memory strings to ensure that the DSG transistors and semiconductor channels of the corresponding memory strings are fully turned off to avoid current leakage. Moreover, to suppress the hot carrier injection (HCI) and gate-induced drain leakage (GIDL) effects due to the negative voltage applied to the DSG transistors in an unselect set of memory strings, which can cause threshold voltage shift of the DSG transistors, the present disclosure further provides various schemes to further improve the operations of the memory devices. In some implementations, the memory strings include additional DSG transistor(s), which are not affected by DSG cuts, and positive voltage(s) are applied to the additional DSG transistors to smoothen the potential change in the semiconductor channels, thereby suppressing the HCI and GIDL effects. In some implementations, the negative voltage is applied only to the DSG transistors in an unselect set of memory strings that is adjacent to a select set of memory strings, but not to other DSG transistors in other nonadjacent unselect set of memory strings, thereby suppressing the HCI and GIDL effects in the nonadjacent sets.

FIG. 1 illustrates a schematic circuit diagram of a memory device 100 including peripheral circuits, according to some aspects of the present disclosure. Memory device 100 can include a memory cell array 101 and peripheral circuits 102 coupled to memory cell array 101. Memory cell array 101 can be a NAND Flash memory cell array in which memory cells 106 are provided in the form of an array of NAND memory strings 108 each extending vertically above a substrate (not shown). In some implementations, each NAND memory string 108 includes a plurality of memory cells 106 coupled in series and stacked vertically. Each memory cell 106 can hold a continuous, analog value, such as an electrical voltage or charge, which depends on the number of electrons trapped within a region of memory cell 106. Each memory cell 106 can be either a floating gate type of memory cell including a floating-gate transistor or a charge trap type of memory cell including a charge-trap transistor.

In some implementations, each memory cell 106 is an SLC that has two possible levels (memory states) and thus, can store one bit of data. For example, the first level "0" can correspond to a first range of threshold voltages, and the second level "1" can correspond to a second range of threshold voltages. In some implementations, each memory cell 106 is an xLC that is capable of storing more than a single bit of data in more than four levels. For example, the xLC may store two bits per cell (MLC), three bits per cell (TLC), or four bits per cell (QLC)). Each xLC can be programmed to assume a range of possible nominal storage values (i.e., corresponding to $2^N$ pieces of N-bits data). In some implementations, at least one of memory cells 106 is set to one of $2^N$ levels corresponding to a piece of N-bits data, where N is an integer greater than 1.

As shown in FIG. 1, each NAND memory string 108 can also include a source select gate (SSG) transistor 110 (a.k.a., bottom select gate (BSG) transistor) at its source end and a drain select gate (DSG) transistor 112 (a.k.a., top select gate (TSG) transistor) at its drain end. SSG transistor 110 and DSG transistor 112 can be configured to activate select NAND memory strings 108 (columns of the array) during read and program operations. In some implementations, the sources of NAND memory strings 108 in the same block 104 are coupled through a same source line (SL) 114, e.g., a common SL. In other words, all NAND memory strings 108 in the same block 104 have an array common source (ACS), according to some implementations. The drain of each NAND memory string 108 is coupled to a respective bit line 116 from which data can be read or written via an output bus (not shown), according to some implementations. In some implementations, each NAND memory string 108 is configured to be selected or deselected by applying a select voltage (e.g., a positive voltage greater than the threshold voltage of DSG transistor 112) or a deselect voltage (e.g., the ground voltage) to the gate of respective DSG transistor 112 through one or more DSG lines 113 and/or by applying a select voltage (e.g., a positive voltage greater than the threshold voltage of SSG transistor 110) or a deselect voltage (e.g., the ground voltage) to the gate of respective SSG transistor 110 through one or more SSG lines 115.

As shown in FIG. 1, NAND memory strings 108 can be organized into multiple blocks 104, each of which can have a common source line 114, e.g., coupled to the ACS. In some implementations, each block 104 is the basic data unit for erase operations, i.e., all memory cells 106 on the same block 104 are erased at the same time. To erase memory cells 106 in a select block 104, source lines 114 coupled to select block 104 as well as unselect blocks 104 in the same plane as select block 104 can be biased with an erase voltage (Vers), such as a high positive bias voltage (e.g., 20 V or more). Memory cells 106 of adjacent NAND memory strings 108 can be coupled through word lines 118 that select which row of memory cells 106 is affected by read and program operations. In some implementations, each word line 118 is coupled to a plurality of memory cells 106. Each word line 118 can include a plurality of control gates (gate electrodes) at each memory cell 106 and a gate line coupling the control gates.

As shown in FIG. 1, memory cell array 101 can include an array of memory cells 106 in a plurality of rows and a plurality of columns in each block 104. One column of memory cells corresponds to one NAND memory string 108, according to some implementations. The plurality of rows of memory cells 106 can be respectively coupled to word lines 118, and the plurality of columns of memory cells 106 can be respectively coupled to bit lines 116. Peripheral circuit 102 can be coupled to memory cell array 101 through bit lines 116 and word lines 118.

Figure 2:
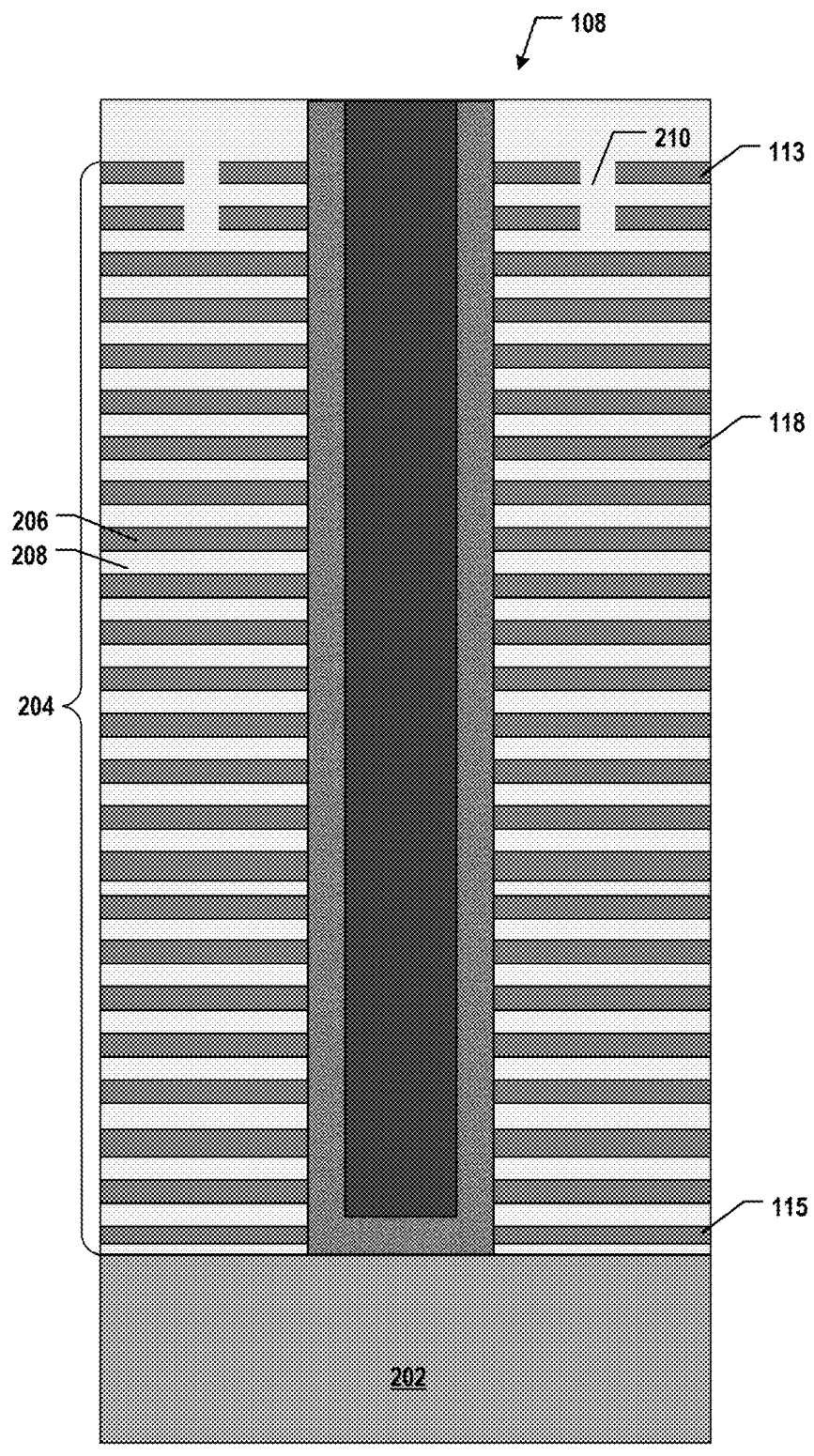
FIG. 2 illustrates a side view of a cross-section of a memory cell array including a NAND memory string, according to some aspects of the present disclosure.

FIG. 2 illustrates a side view of a cross-section of memory cell array 101 including NAND memory string 108, according to some aspects of the present disclosure. As shown in FIG. 2, NAND memory string 108 can extend vertically through a memory stack 204 above a substrate 202. Substrate 202 can include silicon (e.g., single crystalline silicon), silicon germanium (SiGe), gallium arsenide (GaAs), germanium (Ge), silicon on insulator (SOI), germanium on insulator (GOI), or any other suitable materials.

Memory stack 204 can include interleaved gate conductive layers 206 and gate-to-gate dielectric layers 208. The number of the pairs of gate conductive layers 206 and gate-to-gate dielectric layers 208 in memory stack 204 can determine the number of memory cells 106 in memory cell array 101. Gate conductive layer 206 can include conductive materials including, but not limited to, tungsten (W), cobalt (Co), copper (Cu), aluminum (Al), polysilicon, doped silicon, silicides, or any combination thereof. In some implementations, each gate conductive layer 206 includes a metal layer, such as a tungsten layer. In some implementations, each gate conductive layer 206 includes a doped polysilicon layer. Each gate conductive layer 206 can include control gates surrounding memory cells 106, the gates of DSG transistors 112, or the gates of SSG transistors 110, and can extend laterally as DSG line 113 at the top of memory stack 204, SSG line 115 at the bottom of memory stack 204, or word line 118 between DSG line 113 and SSG line 115 Consistent with the scope of the present disclosure, DSG cuts 210 (a.k.a., TSG cuts) are formed through DSG lines 113, which "cut" and thus, electrically separate, DSG lines 113 between adjacent areas (e.g., "sets" referred to herein), such that DSG lines 113 and DSG transistors 112 in different sets may be individually controlled in read/verify operations and/or program operations. Although DSG cut 210 extends vertically through two DSG lines 113 in FIG. 2, it is understood that the number of DSG lines through which DSG cut 210 extends may vary in different examples, as described below in detail.

As shown in FIG. 2, NAND memory string 108 includes a channel structure extending vertically through memory stack 204. In some implementations, the channel structure includes a channel hole filled with semiconductor material (s) (e.g., as a semiconductor channel) and dielectric material (s) (e.g., as a memory film). It is understood that although not shown in FIG. 2, additional components of memory cell array 101 can be formed including, but not limited to, gate line slits/source contacts, local contacts, interconnect layers, etc.

Figure 3:
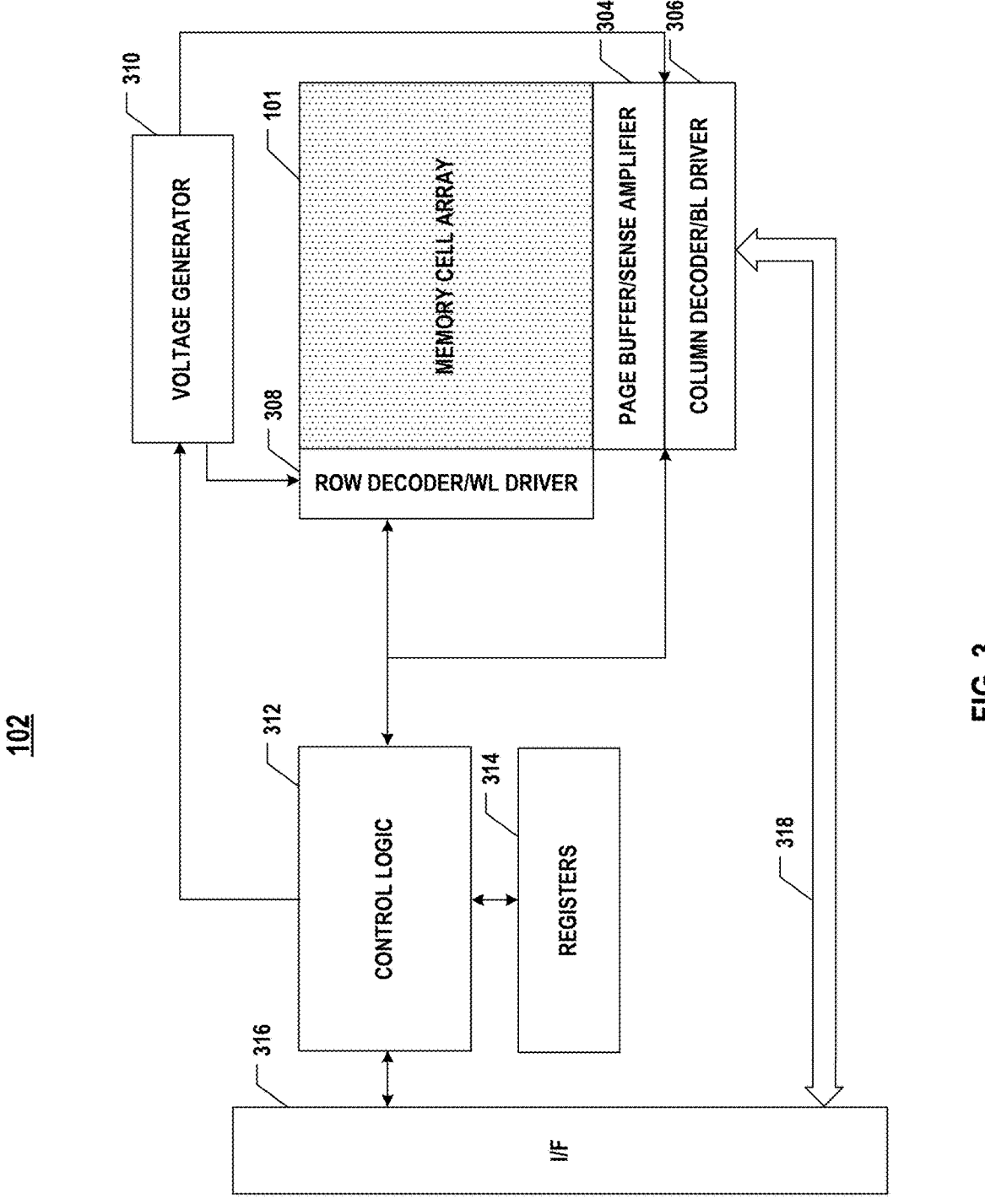
FIG. 3 illustrates a block diagram of a memory device including a memory cell array and peripheral circuits, according to some aspects of the present disclosure.

Referring back to FIG. 1, peripheral circuits 102 can be coupled to memory cell array 101 through bit lines 116, word lines 118, source lines 114, SSG lines 115, and DSG lines 113. Peripheral circuits 102 can include any suitable analog, digital, and mixed-signal circuits for facilitating the operations of memory cell array 101 by applying and sensing voltage signals and/or current signals to and from each select memory cell 106 through bit lines 116, word lines 118, source lines 114, SSG lines 115, and DSG lines 113. Peripheral circuits 102 can include various types of peripheral circuits formed using metal-oxide-semiconductor (MOS) technologies. For example, FIG. 3 illustrates some exemplary peripheral circuits including a page buffer/sense amplifier 304, a column decoder/bit line driver 306, a row decoder/word line driver 308, a voltage generator 310, control logic 312, registers 314, an interface (I/F) 316, and a data bus 318. It is understood that in some examples, additional peripheral circuits not shown in FIG. 3 may be included as well.

Page buffer/sense amplifier 304 can be configured to sense (read) and program (write) data from and to memory cell array 101 according to the control signals from control logic 312. In one example, page buffer/sense amplifier 304 may store one or more pages of program data (write data, referred to herein as "data page") to be programmed. In another example, page buffer/sense amplifier 304 may verify programmed select memory cells 106 in each program/ verify cycle in a program operation to ensure that the data has been properly programmed into memory cells 106 coupled to select word lines 118. In still another example, page buffer/sense amplifier 304 may also sense the low power signals from bit line 116 that represents a data bit stored in memory cell 106 and amplify the small voltage swing to recognizable logic levels in a read operation.

Column decoder/bit line driver 306 can be configured to be controlled by control logic 312 and select one or more NAND memory strings 108 by applying bit line voltages generated from voltage generator 310. Row decoder/word line driver 308 can be configured to be controlled by control logic 312 and select/deselect blocks 104 of memory cell array 101 and select/deselect word lines 118 of block 104. Row decoder/word line driver 308 can be further configured to drive word lines 118 using word line voltages generated from voltage generator 310. In some implementations, row decoder/word line driver 308 can also select/deselect and drive SSG lines 115 and DSG lines 113 as well. Voltage generator 310 can be configured to be controlled by control logic 312 and generate the word line voltages (e.g., read voltage, program voltage, channel pass voltage, local voltage, verify voltage, etc.), bit line voltages, and source line voltages to be supplied to memory cell array 101.

Control logic 312 can be coupled to each peripheral circuit described above and configured to control the operations of each peripheral circuit. Registers 314 can be coupled to control logic 312 and include status registers, command registers, and address registers for storing status information, command operation codes (OP codes), and command addresses for controlling the operations of each peripheral circuit. Interface 316 can be coupled to control logic 312 and act as a control buffer to buffer and relay control commands received from a memory controller (not shown) and/or a host (not shown) to control logic 312 and status information received from control logic 312 to the memory controller and/or the host. Interface 316 can also be coupled to column decoder/bit line driver 306 via data bus 318 and act as a data input/output (I/O) interface and a data buffer to buffer and relay the data to and from memory cell array 101.

FIG. 4 illustrates a schematic diagram of NAND memory strings, according to some aspects of the present disclosure. FIG. 4 shows an example of an array of NAND memory strings (e.g., 108 in FIG. 1) in a block (e.g., 104 in FIG. 1). As shown in FIG. 4, from top to bottom in the vertical direction (the z-direction), each NAND memory string can be coupled to a number of lines in different rows, e.g., bit lines (BLs, e.g., 116 in FIG. 1), DSG lines (DSGLs, e.g., 113 in FIG. 1), word lines (WLs, e.g., 118 in FIG. 1), SSG line (SSGL, e.g., 115 in FIG. 1), and common source line (CSL, e.g., 114 in FIG. 1). As shown in FIG. 4, in both the word line direction (the x-direction) and the bit line direction (the y-direction), the word lines can extend laterally to connect the memory cells of the NAND memory strings and can be applied with a word line voltage in an operation (e.g., the program operation or read/verify operation).

As shown in FIG. 4, in some operations, a bit line can be either a select bit line (Sel BL) that is applied with a select voltage (e.g., the ground voltage, GND) or an inhibit bit line (Inhibit BL) that is applied with an inhibit voltage (e.g., a positive supply voltage, Vdd). As to the DSG lines, the DSG lines may be continuous in the word line direction (the x-direction) to connect the DSG transistors of the NAND memory strings at the same position in the y-direction, but may be separated by DSG cuts (not shown in FIG. 4, e.g., 210 in FIG. 2) in the bit line direction (the y-direction) to form electrically-separated sets, which can be individually controlled in a program operation. During those operations, the DSG lines in select sets and unselect sets can be applied with different voltages as well. In some implementations, a DSG line in the select set is a select DSG line (Sel DSGL) that is applied with a select voltage (e.g., a positive supply voltage, Vcc>Vdd), and a DSG line in the unselect set is an unselect DSG line (Unsel DSGL) that is applied with an unselect (deselect) voltage. Consistent with the scope of the present disclosure, to suppress the current leakage between the bit lines and the DSG transistors 402 in the unselect sets, a negative voltage (Vnxd), instead of the ground voltage, can be used as the unselect voltage applied to the unselect DSG line to ensure that DSG transistors 402 in the unselect set are fully turned off during the operations, as described below in detail.

Figure 5A:
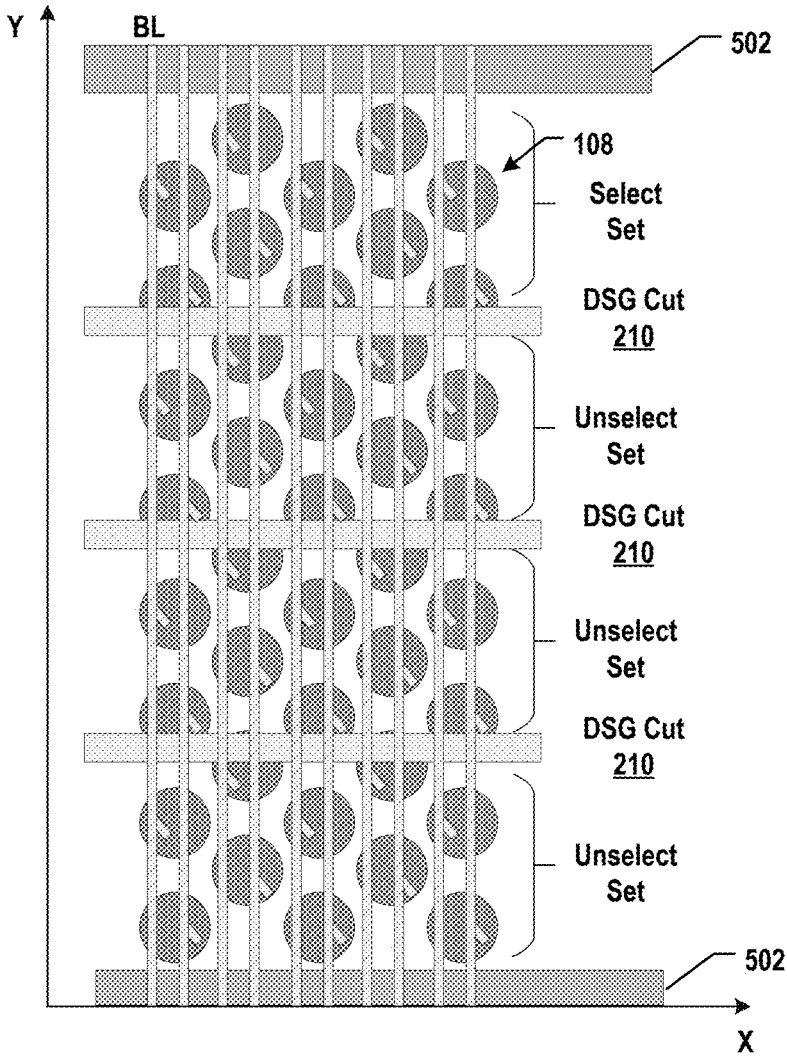
FIG. 5A illustrates a plan view of an array of memory strings, according to some aspects of the present disclosure.
Figure 5B:
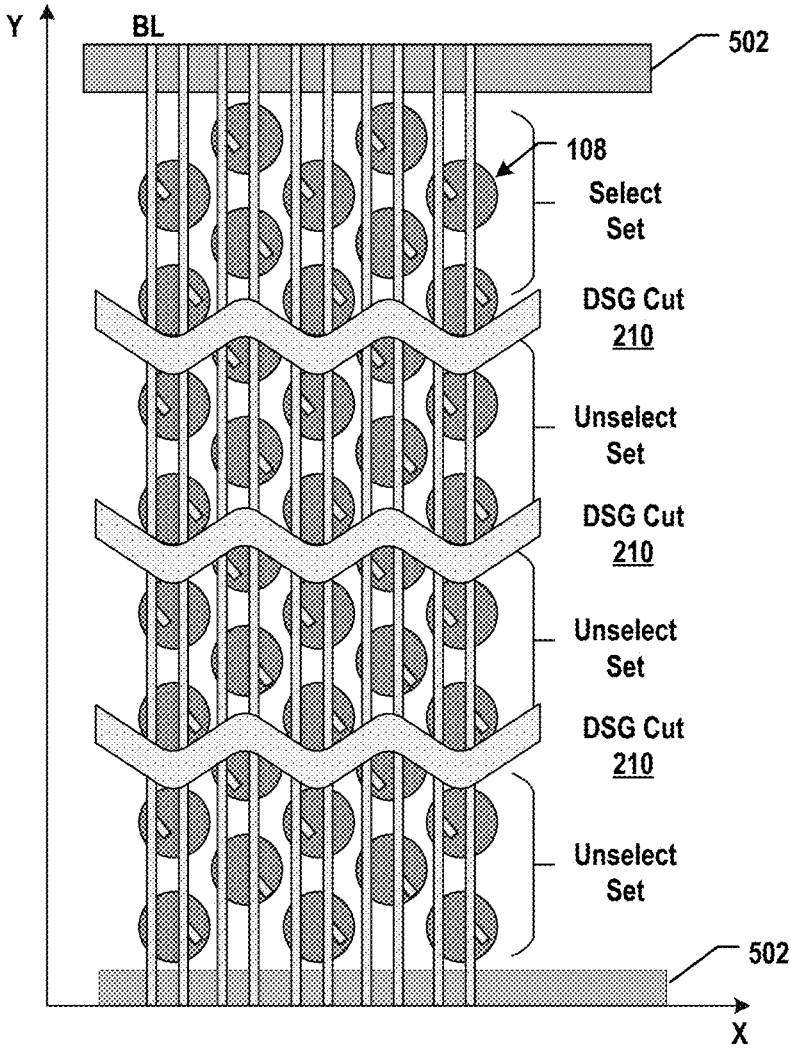
FIG. 5B illustrates a plan view of another array of memory strings, according to some aspects of the present disclosure.

FIG. 5A illustrates a plan view of an array of NAND memory strings 108, according to some aspects of the present disclosure. FIG. 5B illustrates a plan view of another array of NAND memory strings 108, according to some aspects of the present disclosure. As shown in FIGS. 5A and 5B, NAND memory strings 108 can be divided into different blocks in the plan view by a type of insulating structures, such as gate line slits (GLSs) 502. Each GLS 502 can extend laterally in the word line direction (the x-direction) through the memory array region and also extend vertically through all gate conductive layers 206 to electrically separate NAND memory strings 108 in different blocks. GLS 502 can include a dielectric material, such as silicon oxide. In each block, NAND memory strings 108 can be further divided into different sets in the plan view by another type of insulating structure, such as DSG cuts 210. DSG cut 210 can include a dielectric material, such as silicon oxide. A set of NAND memory strings 108 can be either a "select set" or an "unselect set" in an operation (e.g., a program operation or a read/verify operation) depending on whether the voltage applied to DSG lines 113 in the set is a select voltage that turns on corresponding DSG transistors 112 or an unselect voltage that turns off corresponding DSG transistors 112. In some implementations, one of the sets in a block is a select set, while the rest of the sets in the block are all unselect sets.

Each DSG cut 210 can extend vertically through some of gate conductive layers 206, e.g., one or more DSG lines 113, to "cut" those DSG lines 113, thereby electrically separating corresponding DSG transistors 112 in different sets. DSG cuts 210 can also extend laterally within the block in different manners, such as a straight line as shown in FIG. 5A, or a serpentine line as shown in FIG. 5B, in the plan view. As shown in FIGS. 5A and 5B, array of NAND memory strings 108 can be arranged in different sets in the bit line direction (the y-direction), and each DSG cut 210 can be disposed between two adjacent sets of NAND memory strings 108. In some implementations, each DSG cut 210 electrically separates DSG transistors 112 of the two adjacent sets of NAND memory strings 108.

FIG. 6 illustrates a plan view of NAND memory strings 108 and DSG cuts 210, according to some aspects of the present disclosure. As described above with respect to FIG. 2, NAND memory string 108 can include a channel structure having a channel hole filled with semiconductor material(s) (e.g., as a semiconductor channel 602) and dielectric material(s) (e.g., as a memory film 604). In some implementations, semiconductor channel 602 includes silicon, such as polysilicon. In some implementations, memory film 604 is a composite dielectric layer including a tunneling layer 606, a storage layer 608 (also known as a "charge trap/storage layer"), and a blocking layer 610. The channel structure can have a cylinder shape (e.g., a pillar shape). Semiconductor channel 602, tunneling layer 606, storage layer 608, and blocking layer 610 are arranged radially from the center toward the outer surface of the pillar in this order, according to some implementations. Tunneling layer 606 can include silicon oxide, silicon oxynitride, or any combination thereof. Storage layer 608 can include silicon nitride, silicon oxynitride, silicon, or any combination thereof. Blocking layer 610 can include silicon oxide, silicon oxynitride, high dielectric constant (high-k) dielectrics, or any combination thereof. In one example, memory film 604 may include a composite layer of silicon oxide/silicon oxynitride/silicon oxide (ONO). Memory film 604 and surrounding gate electrode 612 (e.g., part of gate conductive layer 206 surrounding NAND memory string 108 in FIG. 2) can form a gate structure surrounding semiconductor channel 602 to control the current flow in semiconductor channel 602.

When forming DSG cut 210 between the adjacent rows of NAND memory strings 108, due to the process limitation, the dimension of DSG cut 210 in the bit line direction (the y-direction) may exceed the spacing between the adjacent rows of NAND memory strings 108, such that part of the channel structure in NAND memory string 108 may be replaced with DSG cut 210. However, due to the process variation when forming DSG cuts 210, semiconductor channel 602 and the corresponding gate structure (memory film 604 and gate electrode 612) may be affected by DSG cut 210 to the same extent as shown in the example on the left side of FIG. 6, or to different extents as shown in the example on the right side of FIG. 6. As shown in the example on the right side of FIG. 6, for NAND memory strings 108 in the lower row, semiconductor channel 602 may remain intact, while part of the gate structure (memory film 604 and gate electrode 612) surrounding semiconductor channel 602 may be replaced by DSG cut 210 (in the dashed line boxes). As a result, the current flow in the part of semiconductor channel 602 in the dashed line box cannot be controlled by the surrounding gate structure. DSG transistors 112 in the lower row thus may not be fully turned off when a normal unselect voltage, e.g., the ground voltage, is applied to their gates, thereby forming a leakage path of the current between DSG transistor 112 and bit line 116 when the lower row of NAND memory strings 108 is in the unselect set in an operation. Moreover, when NAND memory strings 108 in the upper row is in the select set in an operation, a positive select voltage is applied to the gates of DSG transistors in the select set, such that the potential coupling from the select NAND memory strings 108 can further increase the leakage current in the parts of semiconductor channels 602 (in the dashed low boxes) in the unselect NAND memory strings 108.

To suppress or even avoid the current leakage due to DSG cuts 210 as described above with respect to FIG. 6, consistent with the scope of the present disclosure, the normal unselect voltage, e.g., the ground voltage, can be replaced with an enhanced unselect voltage, e.g., a negative voltage, to be applied to the gates of DSG transistors 112 to ensure that DSG transistors 112 in unselect sets can be fully turned off in an operation (e.g., a program or a read/verify operation) even a leakage path is formed due to DSG cut 210 as shown on the right side of FIG. 6. For example, as shown in FIG. 4, a negative voltage (Vnxd), instead of the ground voltage, may be used as the unselect voltage applied to the unselect DSG line to ensure that DSG transistors 402 in the unselect set are fully turned off during the operations.

Replacing the unselect voltage applied to the unselect DSG lines from the ground voltage to a negative voltage may cause a large potential gap between the DSG transistors and the memory cells in the semiconductor channels of NAND memory strings in the unselect sets (unselect NAND memory strings), which may in turn introduce HCI and GILD effects to the semiconductor channels. The HCI and GILD effects, however, can shift down the threshold voltages of the DSG transistors and shift up the threshold voltages of the memory cells close to the DSG transistors, thereby affecting the device performance. According to some aspects of the present disclosure, additional DSG transistors can be included in NAND memory strings, and positive voltages can be applied the additional DSG transistors to create a smoother potential gradient in the semiconductor channels of unselect NAND memory strings, thereby suppressing the HCI/GIDL-caused threshold voltage shift.

Figure 7A:
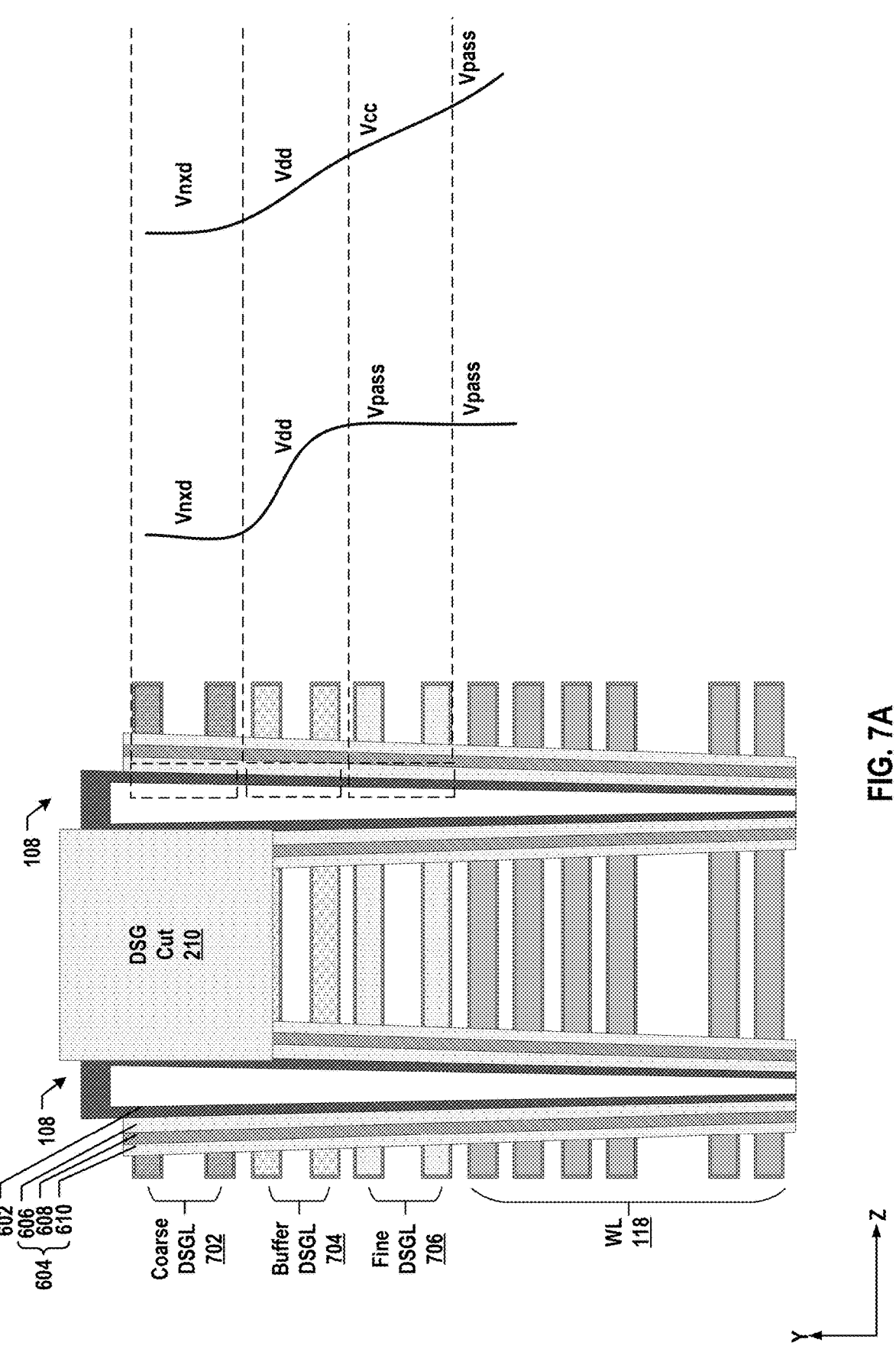
FIG. 7A illustrates a side view of a memory cell array including NAND memory strings, a DSG cut, and various types of DSG transistors, as well as channel potentials of the NAND memory strings, according to some aspects of the present disclosure.

FIG. 7A illustrates a side view of a memory cell array including NAND memory strings 108, DSG cut 210, and various types of DSG transistors, as well as channel potentials of NAND memory strings 108, according to some aspects of the present disclosure. FIG. 7B illustrates a perspective view of memory cell array including NAND memory strings 108 and various types of DSG transistors, according to some aspects of the present disclosure. As shown in FIGS. 7A and 7B, NAND memory string 108 can include, from top to bottom (in the z-direction), one or more coarse DSG transistors (CDSGs) coupled to one or more coarse DSG lines 702 (Coarse DSGLs), one or more buffer DSG transistors (BDSGs) coupled to one or more buffer DSG lines 704 (Buffer DSGLs), and one or more fine DSG transistors (FDSGs) coupled to one or more fine DSG lines 706 (Fine DSGLs). As shown in FIG. 7A, DSG cut 210 extends vertically (in the z-direction) through coarse DSG lines 702 and stop before reaching fine DSG lines 706, according to some implementations. In some implementations, buffer DSG lines 704 (and the buffer DSG transistors) are vertically closer to DSG cut 210 (in the z-direction) than fine DSG lines 706 (and the fine DSG transistors). It is understood that due to process variation, DSG cut 210 may stop before reaching buffer DSG lines 704 or may extend through some of buffer DSG lines 704. That is, DSG cut 210 cuts each coarse DSG line 702 to electrically separate the coarse DSG transistors in two adjacent sets, but does not cut any fine DSG line 706, such that the fine DSG transistors in the adjacent sets are still electrically connected by fine DSG lines 706, according to some implementation. Buffer DSG lines 704 can serve as a "buffer" to ensure that DSG cut 210 would not extend to fine DSG lines 706. In some implementations, coarse DSG transistors are controlled at the set level (per set control) since coarse DSG lines 702 in a block are cut by DSG cut 210 between different sets, while fine DSG transistors and buffer DSG transistors are controlled at the block level (per block control) since fine DSG lines 706 and buffer DSG lines 704 in the same block are not cut by DSG cut 210.

In some implementations, a negative voltage (Vnxd) is applied to coarse DSG line 702, a first positive voltage (Vdd) is applied to buffer DSG line 704, and a second positive voltage (Vcc or Vpass) that is greater than the first positive voltage to fine DSG line 706. As a result, the potential change in semiconductor channels 602 of NAND memory strings 108 in the unselect sets in an operation (e.g., a program operation or a read/verify operation) can be smoothened on the right side of FIG. 7A. In one example, when a positive pass voltage Vpass (greater than the positive supply voltage Vcc) is applied to word line 118 and fine DSG line 706, the potential in semiconductor channel 602 may gradually increase from Vnxd (in the region corresponding to coarse DSG transistors), to Vdd (in the region corresponding to buffer DSG transistors), and to Vpass (in the regions corresponding to fine DSG transistors and memory cells). In another example, when the positive supply voltage Vcc is applied to fine DSG line 706, the potential in semiconductor channel 602 may gradually increase from Vnxd (in the region corresponding to coarse DSG transistors), to Vdd (in the region corresponding to buffer DSG transistors), to Vcc (in the region corresponding to fine DSG transistors), and to Vpass (in the region corresponding to memory cells). As a result, the HCI/GIDL-caused threshold voltage shift can be suppressed by introducing the fine and buffer DSG transistors that are positively biased in an operation.

The operations in which the schemes disclosed herein can include any suitable operations of memory devices (e.g., NAND Flash memory devices) that control an individual set of memory strings (per set control), including but not limited to, a program operation and a read operation.

To perform a program operation, in addition to page buffer/sense amplifier 304 providing to each select memory cell 106 the corresponding piece of data, row decoder/word line driver 308 can be configured to apply program voltages and verify voltages to a select word line 118 coupled to a select row of memory cells 106 in one or more program/verify cycles in order to raise the threshold voltage of each select memory cell 106 to a desired level (into a desired range of threshold voltages) based on the corresponding piece of data. For example, FIGS. 8A and 8B illustrate a waveform of word line voltages applied to a select word line in a program operation, according to some aspects of the present disclosure.

Figure 8A:
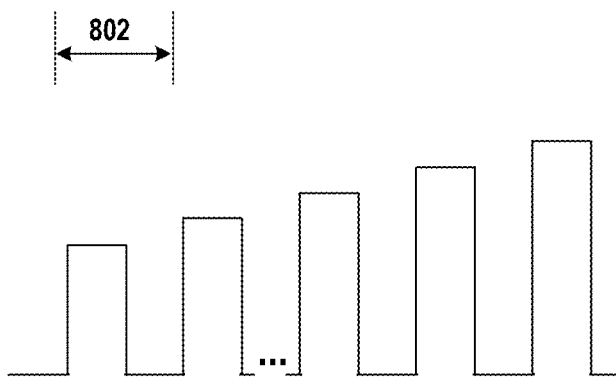
FIGS. 8A and 8B illustrate a waveform of word line voltages applied to a select word line in a program operation, according to some aspects of the present disclosure.
Figure 8B:
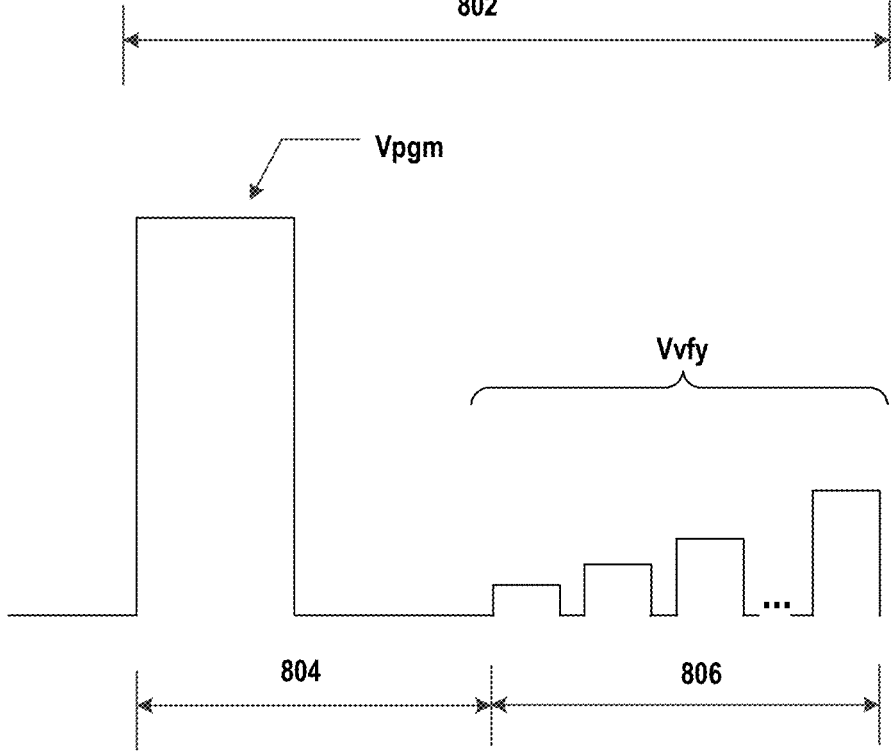

As shown in FIGS. 8A and 8B, the program operation includes one or more loops 802, each of which includes a program cycle 804 and a verify cycle 806, according to some implementations. As shown in FIG. 8B, in each loop 802, row decoder/word line driver 308 can be configured to apply a program voltage (Vpgm) on select word line 118 to select row of memory cells 106 in program cycle 804 and sequentially apply one or more verify voltages (Vvfy) to verify select row of memory cells 106 in verify cycle 806. That is, in each loop 802, peripheral circuit 102 can perform verification of select row of memory cells 106 at one or more levels in verify cycle 806 after applying a program voltage in program cycle 804. The number of verify voltages applied in verify cycle 806 depends on the level being programmed by the specific loop 802, according to some implementations. As a result, at the end of the program operation, for example, select memory cell 106 may be programmed into one of the 2N levels based on the corresponding N bits of data to be stored in select memory cell 106, where N is a positive integer.

As described above with respect to FIG. 8B, a program operation can include a program process performed in program cycle 804 and a verify process performed in verify cycle 806. For ease of description, the "program operation" used herein may refer to the program process in a program operation, and the "verify operation" used herein may refer to the verify process in a program operation. Since the verify process in a program operation is similar to a read operation, the "read/verify operation" used herein may refer to the read operation and/or the verify process in a program operation.

Figure 9:
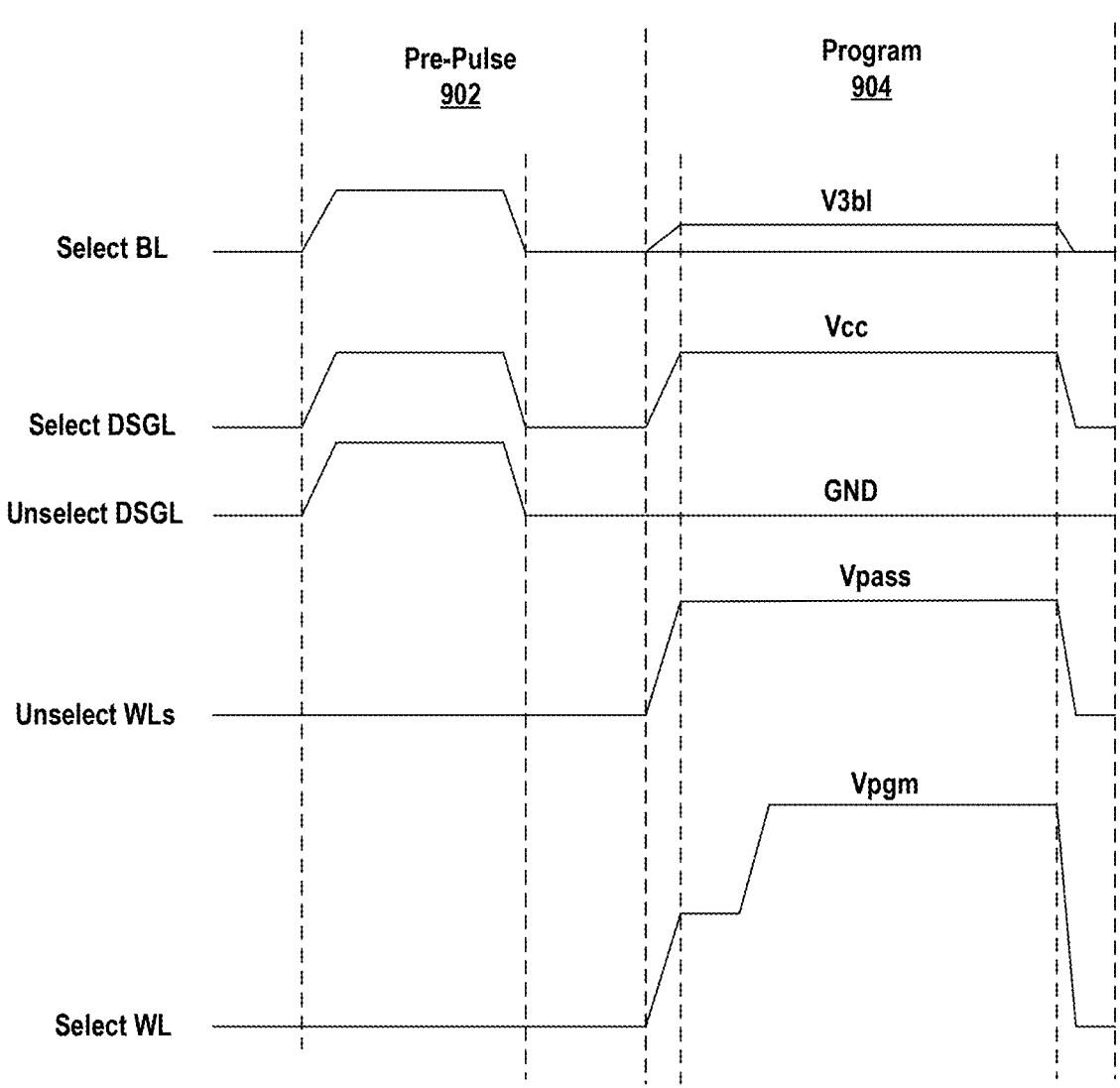
FIG. 9 illustrates timing diagrams of a program operation.

FIG. 9 illustrates timing diagrams of a program operation. Specifically, FIG. 9 corresponds to one program cycle 804 in a program operation, which includes a pre-pulse period 902 and a program period 904. In pre-pulse period 902, a positive select voltage (e.g., Vcc) is applied to each select and unselect DSG line (DSGL) to turn on the select and unselect DSG transistors, and a positive bias voltage is applied to each select bit line (BL) to remove residual electrons in the semiconductor channels of the NAND memory strings and set the channel potential to the desired level before program period 904, also known as "pre-pulse channel cleaning." In program period 904, a program voltage (Vpgm) is applied to the select word line (WL) to program the select memory cells coupled to the select word line, and various positive voltages at different levels (e.g., Vcc and Vpass) are applied to each select DSG line and unselect word line to turn on the semiconductor channels of select NAND memory strings (NAND memory strings in the select sets) for programming. For example, a positive supply voltage (Vcc) may be applied to the select DSG line to turn on the select DSG transistor, and a positive pass voltage (Vpass) greater than the positive supply voltage (Vcc) may be applied to each unselect word line to turn on each unselect memory cell. Also, a three-bit line bias voltage (V3bl) is applied to the select bit line to achieve fine-tuning of the threshold voltages of the programmed memory cells in conjunction with the positive supply voltage (Vcc) applied to each select DSG line.

As shown in FIG. 9, for unselect NAND memory strings (NAND memory strings in the unselect sets), the ground voltage (GND) is applied to the unselect DSG line to turn off the unselect DSG transistors in order to cut off the semiconductor channels and currents therein. As described above, due to the process limitation and variation, the semiconductor channels of some unselect NAND memory strings may not be fully cut off by applying the ground voltage to the unselect DSG line, thereby causing current leakage.

Figure 10:
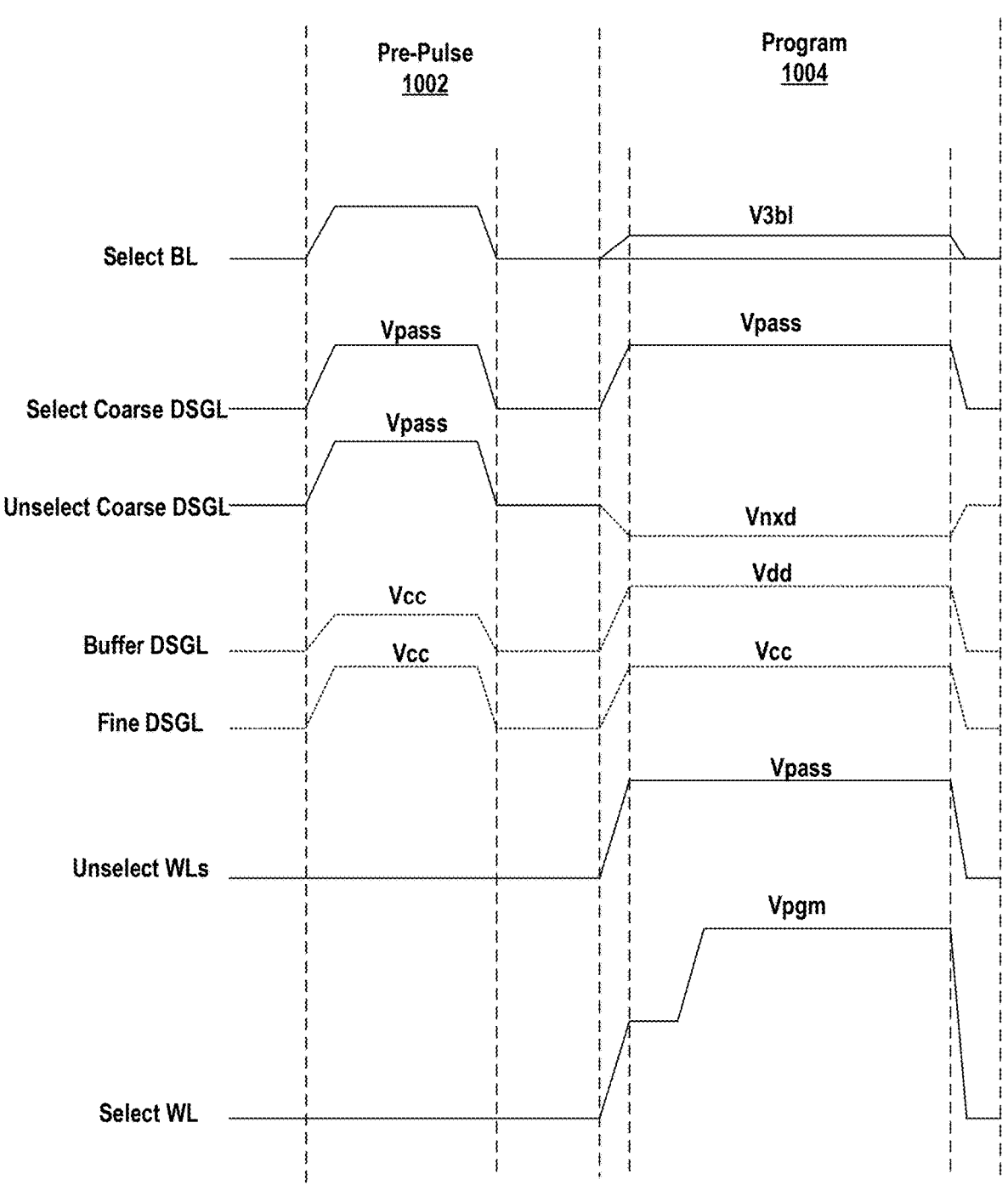
FIG. 10 illustrates timing diagrams of a program operation, according to some aspects of the present disclosure.

FIG. 10 illustrates timing diagrams of a program operation, according to some aspects of the present disclosure. Specifically, FIG. 10 corresponds to one program cycle 804 in a program operation, which includes a pre-pulse period 1002 and a program period 1004. As described above with respect to FIGS. 7A and 7B, in the program operation, the select NAND memory strings can include select coarse DSG transistors coupled to one or more select coarse DSG lines (DSGLs), and the unselect NAND memory strings can include unselect coarse DSG transistors coupled to one or more unselect coarse DSG lines (DSGLs); the select and unselect NAND memory strings can further include buffer DSG transistors coupled to one or more buffer DSG lines (DSGLs) and fine DSG transistors coupled to one or more fine DSG lines (DSGLs). In some implementations, the select coarse DSG lines and the unselect coarse DSG lines are separated by DSG cuts between different sets, the fine DSG lines in the same block are not separated by the DSG cuts, and the buffer DSG lines in the same block may be or may not be separated by the DSG cuts.

As shown in FIG. 10, in pre-pulse period 1002, word line driver 308 of peripheral circuit 102 can be configured to apply positive select voltages to each select and unselect coarse DSG line, buffer DSG line, and fine DSG line to turn on the select and unselect coarse DSG transistors, buffer DSG transistors, and fine DSG transistors, and apply a positive bias voltage to each select bit line (BL) to remove residual electrons in the semiconductor channels of the NAND memory strings and set the channel potential to the desired level before program period 1004, also known as "pre-pulse channel cleaning." In some implementations, the positive select voltage applied to each select and unselect coarse DSG line is a positive pass voltage (Vpass) that is greater than the positive supply voltage (Vcc) in the example shown in FIG. 9, such that the threshold voltage variation of the coarse DSG transistors caused by the process limitation and variation of the DSG cuts can be compensated by the increased select voltage Vpass, which can ensure that all the coarse DSG transistors can be turned on in pre-pulse period 1002. In some implementations, the positive select voltage applied to each buffer and fine DSG line is a positive supply voltage (e.g., Vcc) smaller than the positive pass voltage (Vpass) applied to the coarse DSG line since the threshold voltages of the buffer and fine DSG transistors are not supposed to be affected by the DSG cuts.

As shown in FIG. 10, in program period 1004, word line driver 308 of peripheral circuit 102 can be configured to apply a program voltage (Vpgm) to the select word line to program the select memory cells coupled to the select word line. Word line driver 308 can also be configured to apply various positive voltages at different levels (e.g., Vcc, Vdd, and Vpass) to select coarse DSG line, buffer DSG line, fine DSG line, and unselect word lines to turn on the semiconductor channels of select NAND memory strings for programming. In some implementations, the positive select voltage applied to each select coarse DSG line is a positive pass voltage (Vpass) that is greater than the positive supply voltage (Vcc) in the example shown in FIG. 9, such that the threshold voltage variation of the select coarse DSG transistors caused by the process limitation and variation of the DSG cuts can be compensated by the increased select voltage Vpass, which can ensure that all the select coarse DSG transistors can be turned on in program period 1004. In one example, the same positive pass voltage (Vpass) may be applied to the unselect word line as well in program period 1004. In some implementations, the positive select voltage applied to each fine DSG line is a first positive supply voltage (Vcc) that is greater than a second positive supply voltage (Vdd) applied to each buffer fine DSG line. For example, Vpass>Vcc>Vdd. In some implementations, a three-bit line bias voltage (V3bl) is applied to the select bit line to achieve fine-tuning of the threshold voltages of the programmed memory cells in conjunction with the positive supply voltage (Vcc) applied to each fine DSG line.

The two functions of the select DSG transistors in the example of FIG. 9, i.e., (1) turning on the semiconductor channel, and (2) fine-tuning threshold voltages of the programmed memory cells, can be performed by the select coarse DSG transistors and the fine DSG transistors, respectively, in the NAND memory strings of FIG. 10, as described above. Instead of using the same positive select voltage Vcc for both functions, a higher positive select voltage Vpass, instead of Vcc, can be used to ensure that each the semiconductor channel of each select NAND memory string is opened even under the influence of DSG cuts, while the lower positive select voltage Vcc can still be used to fine-tune the threshold voltages of the programmed memory cells with the three-bit line bias voltage applied to the select bit line.

As to the unselect NAND memory strings in the unselect sets, as shown in FIG. 10, in program period 1004, word line driver 308 of peripheral circuit 102 can be configured to apply a negative voltage (Vnxd) to each unselect coarse DSG line during applying the program voltage to the select word line. Compared with the example of FIG. 9 in which the ground voltage is applied to each unselect DSG line, the negative voltage applied to the gates of the unselect coarse DSG transistors can suppress current leakage even under the influence of DSG cuts and help to ensure that the semiconductor channels of the unselect NAND memory strings are closed. In some implementations, the negative voltage is between about −5 V and about 0 V, such as between −5 V and 0 V (e.g., −5 V, −4.5 V, −4 V, −3.5 V, −3 V, −2.5 V, −2 V, −1.5 V, −1 V, −0.5 V, −0.4 V, −0.3 V, −0.2 V, −0.1 V, any range bounded by the lower end by any of these values, or in any range defined by any two of these values).

On the other hand, during applying the negative voltage to the unselect coarse DSG line, positive voltages at different levels (Vcc and Vdd) are applied to the fine DSG line and buffer DSG line, respectively, as described above, according to some implementations. As a result, a smooth potential gradient (e.g., as shown in FIG. 7A) can be formed in the semiconductor channels of unselect NAND memory strings even when a negative voltage is applied to the unselect coarse DSG line, thereby suppressing the HCI effects that may be caused by the negative voltage.

Figure 11:
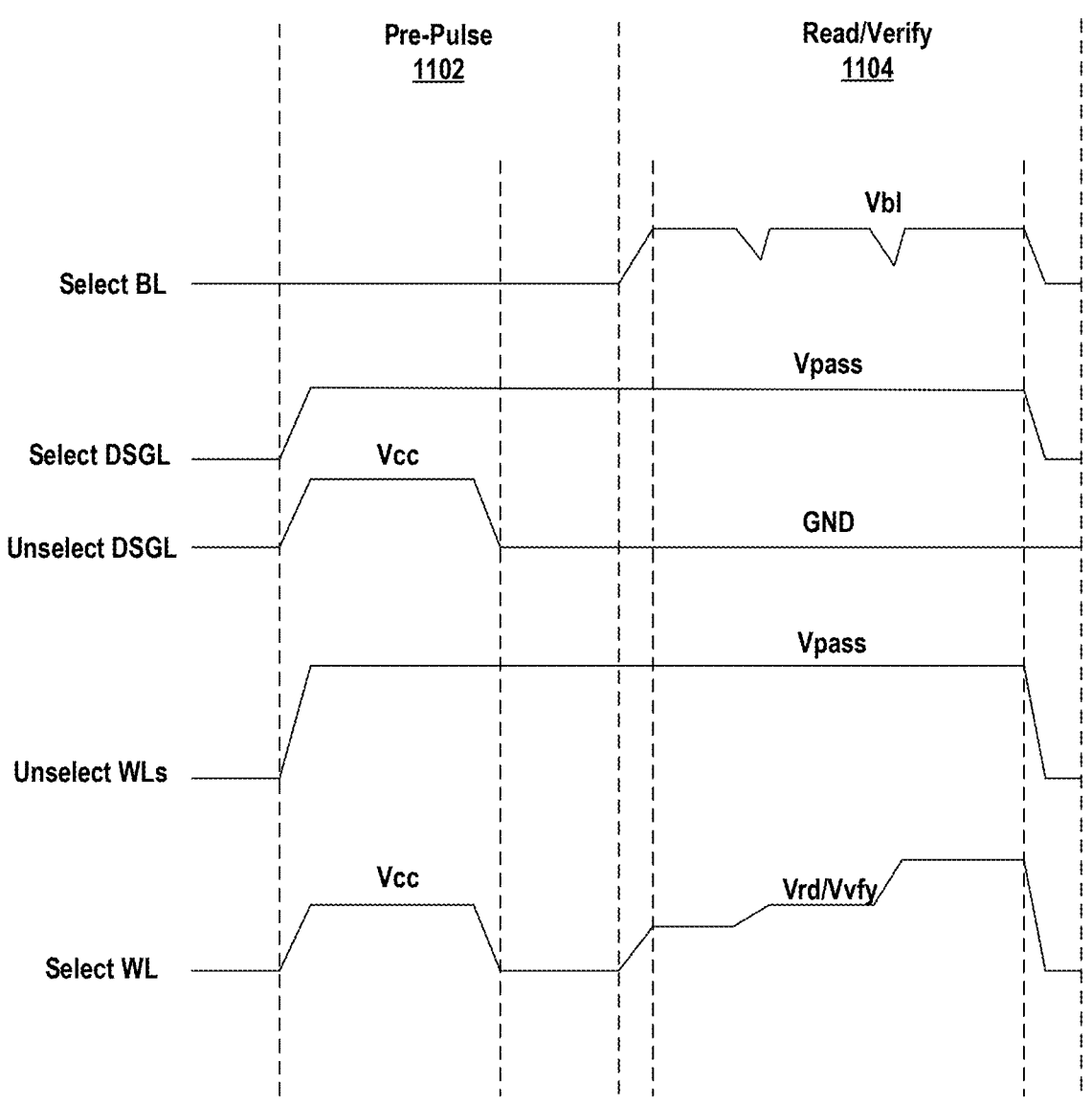
FIG. 11 illustrates timing diagrams of a read/verify operation.

FIG. 11 illustrates timing diagrams of a read/verify operation. Specifically, FIG. 11 corresponds to one verify cycle 804 in a program operation or a read operation, which includes a pre-pulse period 1102 and a read/verify period 1104. In pre-pulse period 1102, positive select voltages (e.g., Vcc and Vpass) are applied to each select and unselect DSG line (DSGL) and each select and unselect word line (WL) to turn on the select and unselect DSG transistors and the select and unselect memory cells, and the ground voltage is applied to each select bit line (BL) to remove residual electrons in the semiconductor channels of the NAND memory strings and set the channel potential to the desired level before read/verify period 1104, also known as "pre-pulse channel cleaning." In read/verify period 1104, a read/verify voltage (Vrd/Vvfy) is applied to the select word line to read/verify the select memory cells coupled to the select word line, and a positive voltage (e.g., Vpass) is applied to each select DSG line and unselect word line to turn on the semiconductor channels of select NAND memory strings for reading/verifying. Also, a bias voltage (Vbl) is applied to the select bit line during applying the read/verify voltage to the select word line.

As shown in FIG. 11, for unselect NAND memory strings, the ground voltage (GND) is applied to the unselect DSG line to turn off the unselect DSG transistors in order to cut off the semiconductor channels and currents therein. As described above, due to the process limitation and variation, the semiconductor channels of some unselect NAND memory strings may not be fully cut off by applying the ground voltage to the unselect DSG line, thereby causing current leakage.

Figure 12:
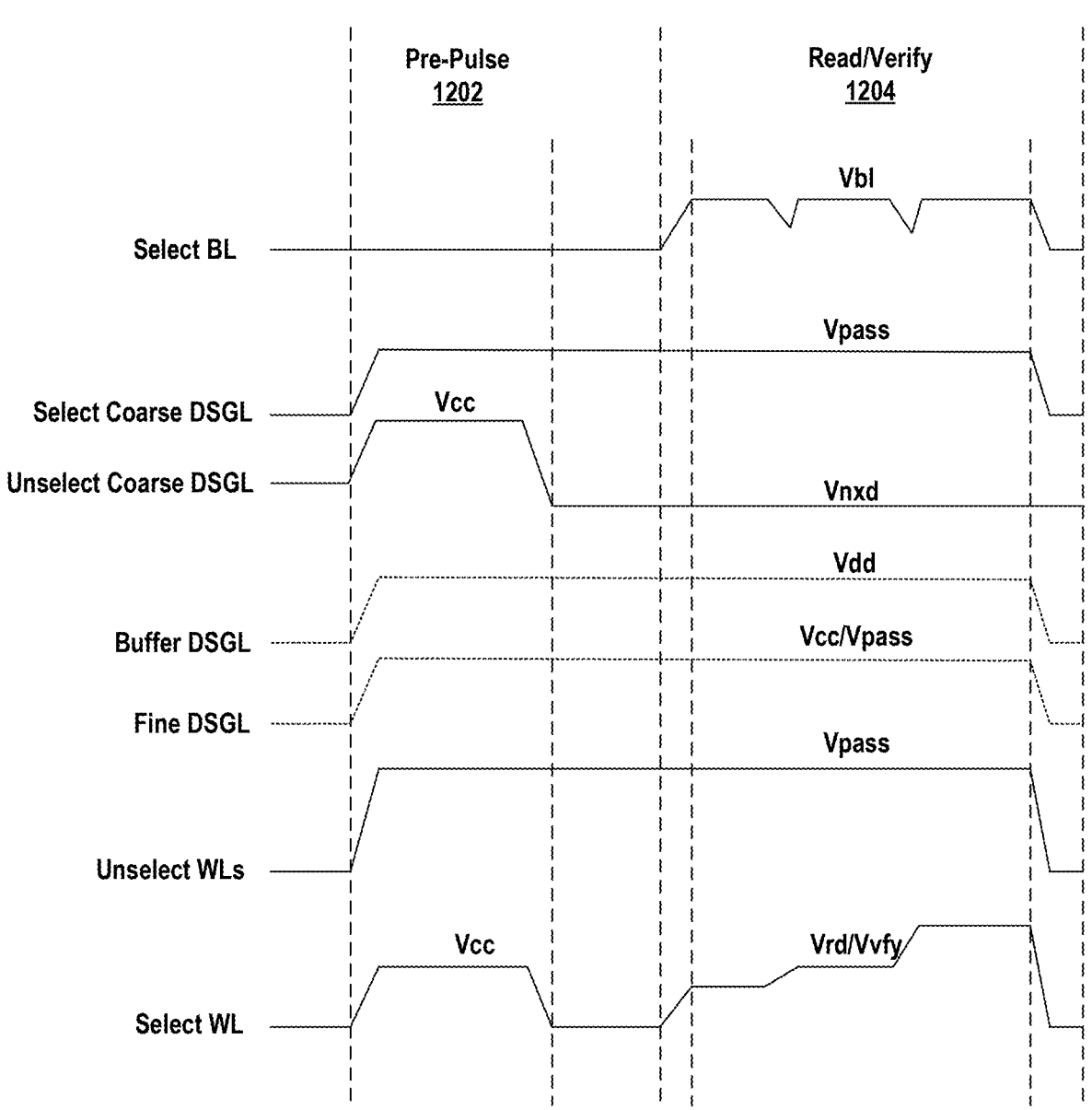
FIG. 12 illustrates timing diagrams of a read/verify operation, according to some aspects of the present disclosure.

FIG. 12 illustrates timing diagrams of a read/verify operation, according to some aspects of the present disclosure. Specifically, FIG. 12 corresponds to one verify cycle 804 in a program operation or a read operation, which includes a pre-pulse period 1202 and a read/verify period 1204. As described above with respect to FIGS. 7A and 7B, in the read/verify operation, the select NAND memory strings can include select coarse DSG transistors coupled to one or more select coarse DSG lines (DSGLs), and the unselect NAND memory strings can include unselect coarse DSG transistors coupled to one or more unselect coarse DSG lines (DSGLs); the select and unselect NAND memory strings can further include buffer DSG transistors coupled to one or more buffer DSG lines (DSGLs) and fine DSG transistors coupled to one or more fine DSG lines (DSGLs). In some implementations, the select coarse DSG lines and the unselect coarse DSG lines are separated by DSG cuts between different sets, the fine DSG lines in the same block are not separated by the DSG cuts, and the buffer DSG lines in the same block may be or may not be separated by the DSG cuts.

As shown in FIG. 12, in pre-pulse period 1202, word line driver 308 of peripheral circuit 102 can be configured to apply various positive select voltages at different levels (e.g., Vdd, Vcc, and Vpass) to each select and unselect coarse DSG line, buffer DSG line, and fine DSG line to turn on the select and unselect coarse DSG transistors, buffer DSG transistors, and fine DSG transistors, and apply the ground voltage to each select bit line (BL) to remove residual electrons in the semiconductor channels of the NAND memory strings and set the channel potential to the desired level before read/verify period 1204, also known as "pre-pulse channel cleaning."

As shown in FIG. 12, in read/verify period 1204, word line driver 308 of peripheral circuit 102 can be configured to apply a read/verify voltage (Vrd/Vvfy) to the select word line to read or verify the select memory cells coupled to the select word line. Word line driver 308 can also be configured to apply various positive voltages at different levels (e.g., Vcc, Vdd, and Vpass) to select coarse DSG line, buffer DSG line, fine DSG line, and unselect word lines to turn on the semiconductor channels of select NAND memory strings for reading/verifying. In some implementations, the same positive voltage is maintained from pre-pulse period 1202 to ready/verify period 1204 on a select coarse DSG line, buffer DSG line, fine DSG line, or unselect word line. In some implementations, the positive select voltage applied to each select coarse DSG line is a positive pass voltage (Vpass) that is greater than the positive supply voltage (Vcc), such that the threshold voltage variation of the select coarse DSG transistors caused by the process limitation and variation of the DSG cuts can be compensated by the increased select voltage Vpass, which can ensure that all the select coarse DSG transistors can be turned on in read/verify period 1204. In one example, the same positive pass voltage (Vpass) may be applied to the unselect word line as well in read/verify period 1204. In some implementations, the positive select voltage applied to each fine DSG line is the positive pass voltage (Vpass), or a first positive supply voltage (Vcc) that is greater than a second positive supply voltage (Vdd) applied to each buffer fine DSG line. For example, Vpass>Vcc>Vdd. In some implementations, a bias voltage (Vbl) is applied to the select bit line during applying the read/verify voltage to the select word line.

As to the unselect NAND memory strings in the unselect sets, as shown in FIG. 12, in read/verify period 1204, word line driver 308 of peripheral circuit 102 can be configured to apply a negative voltage (Vnxd) to each unselect coarse DSG line during applying the read/verify voltage to the select word line. Compared with the example of FIG. 11 in which the ground voltage is applied to each unselect DSG line, the negative voltage applied to the gates of the unselect coarse DSG transistors can suppress current leakage even under the influence of DSG cuts and help to ensure that the semiconductor channels of the unselect NAND memory strings are closed. In some implementations, the negative voltage is between about −5 V and about 0 V, such as between −5 V and 0 V (e.g., −5 V, −4.5 V, −4 V, −3.5 V, −3 V, −2.5 V, −2 V, −1.5 V, −1 V, −0.5 V, −0.4 V, −0.3 V, −0.2 V, −0.1 V, any range bounded by the lower end by any of these values, or in any range defined by any two of these values).

On the other hand, during applying the negative voltage to the unselect coarse DSG line, positive voltages at different levels (Vpass/Vcc and Vdd) are applied to the fine DSG line and buffer DSG line, respectively, as described above, according to some implementations. As a result, a smooth potential gradient (e.g., as shown in FIG. 7A) can be formed in the semiconductor channels of unselect NAND memory strings even when a negative voltage is applied to the unselect coarse DSG line, thereby suppressing the HCI effects that may be caused by the negative voltage.

As described above, replacing the unselect voltage applied to the unselect DSG lines from the ground voltage to a negative voltage may introduce HCI and GILD effects to the semiconductor channels, which can shift down the threshold voltages of the DSG transistors and shift up the threshold voltages of the memory cells close to the DSG transistors, thereby affecting the device performance. According to some aspects of the present disclosure, the negative voltage is applied only to unselect DSG lines in an unselect set of memory strings that is adjacent to a select set of memory strings, but not to unselect DSG lines in other nonadjacent unselect sets of memory strings, thereby avoiding the HCI and GIDL effects in the nonadjacent sets of memory strings.

Figure 13:
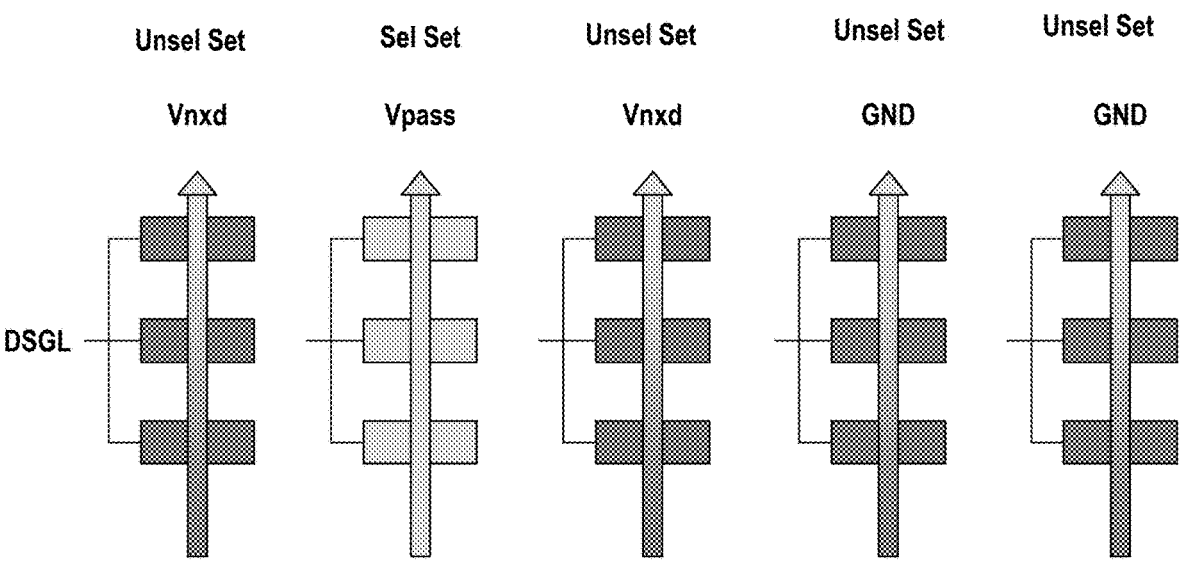
FIG. 13 illustrates voltages applied to DSG lines in an operation, according to some aspects of the present disclosure.

For example, FIG. 13 illustrates voltages applied to DSG lines in an operation, according to some aspects of the present disclosure. As shown in FIG. 13, a memory device can include multiple sets of NAND memory strings separated by DSG cuts (e.g., in FIGS. 5A and 5B) in a block. During an operation (e.g., a program operation or a read/verify operation), one of the sets can be selected to become the select set, while the rest of the sets can be unselected to become the unselect sets. For the select set, a positive pass voltage (Vpass) can be applied to the DSG lines (select DSG lines) during the operation, as described above in detail. As to the unselect sets, depending on whether an unselect set is adjacent to the select set (and thus being affected by Vpass) or nonadjacent to the select set (and thus not or less being affected by Vpass), various unselect voltage at different levels (Vnxd and GND) can be applied to the DSG lines (unselect DSG lines). In some implementations, for unselect DSG lines in the unselect sets adjacent to the select set, the negative voltage (Vnxd) is applied, as described above in detail to suppress the current leakage in the adjacent sets. In contrast, for unselect DSG lines in the unselect sets that are not adjacent to the select set, the ground voltage (GND) is applied to avoid the HCI and GIDL effects in the nonadjacent sets, according to some implementations.

FIG. 14 illustrates a flowchart of a method 1400 for operating a memory device, according to some aspects of the present disclosure. The memory device may be any suitable memory device disclosed herein, such as memory device 100. Method 1400 may be implemented by peripheral circuit 102, such as row decoder/word line driver 308, page buffer/sense amplifier 304, and control logic 312. It is understood that the operations shown in method 1400 may not be exhaustive and that other operations can be performed as well before, after, or between any of the illustrated operations. Further, some of the operations may be performed simultaneously, or in a different order than shown in FIG. 14.

Method 1400 can be applied to a memory device including memory strings each including a first DSG transistor, an insulating structure disposed between two adjacent sets of the memory strings and electrically separating the first DSG transistors of the two adjacent sets of the memory strings, and first DSG lines each coupled to the first DSG transistors in a respective set of the two adjacent sets of the memory strings. In some implementations, the unselect first DSG line is coupled to the first DSG transistors in an unselect set of the two adjacent sets of the memory strings. In some implementations, the insulating structure extends laterally in a straight line or a serpentine line, and extends vertically through the first DSG lines. In some implementations, each memory string further includes a second DSG transistor, and the memory device further includes a second DSG line coupled to the second DSG transistors of the memory string. In some implementations, each memory string further includes a third DSG transistor, and the memory device further includes a third DSG line coupled to the second DSG transistors of the memory string. In some implementations, the third DSG line is vertically closer to the insulating structure than the second DSG line.

For example, as shown in FIGS. 5A, 5B, 7A, and 7B, NAND memory string 108 may include, from top to bottom in the vertical direction (the z-direction), coarse DSG transistors (first DSG transistors) coupled to coarse DSG lines 702 (first DSG lines), buffer DSG transistors (third DSG transistors) coupled to buffer DSG lines 704 (third DSG lines), and fine DSG transistors (second DSG transistors) coupled to fine DSG lines 706 (second DSG lines). The memory device may also include DSG cut 210 disposed between two adjacent sets of NAND memory strings 108 in the bit line direction (the y-direction) in the plan view and electrically separating the coarse DSG transistors in the two adjacent sets. DSG cut 210 may extend laterally in a straight line or a serpentine line in the word line direction (the x-direction) in the plan view, and extend vertically through coarse DSG lines 702 and stop before reaching fine DSG lines 706.

Referring to FIG. 14, method 1400 starts at operation 1402, in which a negative voltage is applied to an unselect first DSG line in an operation of a memory device. At operation 1404, during applying the negative voltage to the unselect first DSG line, a program voltage or a read/verify voltage is applied to a select word line of the word lines to program, read, or verify select memory cells of the memory cells coupled to the select word line. At operation 1406, during applying the negative voltage to the unselect first DSG line, a first positive voltage is applied to the second DSG line to turn on the second DSG transistors. At operation 1408, during applying the negative voltage to the unselect first DSG line, a second positive voltage smaller than the first positive voltage is applied to the third DSG line to turn on the third DSG transistors. At operation 1410, during applying the negative voltage to the unselect first DSG line, a third positive voltage is applied to a select first DSG line of the first DSG line that is coupled to the first DSG transistors in a select set of the two adjacent sets of the memory strings. In some implementations, the third positive voltage is greater than the first positive voltage.

For example, as shown in FIGS. 1-3 and 10, in program period 1004 of a program operation, a negative voltage (Vnxd) may be applied to the unselect coarse DSG line (unselect first DSG line) to turn off the coupled unselect coarse DSG transistors (unselect first DSG transistors) in an unselect set by word line driver 308 of peripheral circuit 102. During applying the negative voltage to the unselect coarse DSG line, a program voltage (Vprm) may be applied to select word line to program the coupled select memory cells by word line driver 308 of peripheral circuit 102. During applying the negative voltage to the unselect coarse DSG line, a first positive supply voltage (Vcc) may be applied to the fine DSG lines (second DSG lines) to turn on the coupled fine DSG transistors (second DSG transistors) in select and unselect sets, and a second positive supply voltage (Vdd) smaller than the first positive supply voltage (Vdd)

may be applied to the buffer DSG lines (third DSG lines) to turn on the coupled buffer DSG transistors (third DSG transistors) in select and unselect sets by word line driver 308 of peripheral circuit 102. During applying the negative voltage to the unselect coarse DSG line, a positive pass voltage (Vpass) greater than the first positive supply voltage (Vcc) may be applied to the select coarse DSG lines (select first DSG line) to turn on the coupled select coarse DSG transistors (select first DSG transistors) in a select set by word line driver 308 of peripheral circuit 102.

For example, as shown in FIGS. 1-3 and 12, in read/verify period 1204 of a read/verify operation, a negative voltage (Vnxd) may be applied to the unselect coarse DSG line (unselect first DSG line) to turn off the coupled unselect coarse DSG transistors (unselect first DSG transistors) in an unselect set by word line driver 308 of peripheral circuit 102. During applying the negative voltage to the unselect coarse DSG line, a read voltage (Vrd) or a verify voltage (Vvfy) may be applied to select word line to read or verify the coupled select memory cells by word line driver 308 of peripheral circuit 102. During applying the negative voltage to the unselect coarse DSG line, a first positive supply voltage (Vcc or Vpass) may be applied to the fine DSG lines (second DSG lines) to turn on the coupled fine DSG transistors (second DSG transistors) in select and unselect sets, and a second positive supply voltage (Vdd) smaller than the first positive supply voltage (Vdd or Vpass) may be applied to the buffer DSG lines (third DSG lines) to turn on the coupled buffer DSG transistors (third DSG transistors) in select and unselect sets by word line driver 308 of peripheral circuit 102. During applying the negative voltage to the unselect coarse DSG line, a positive pass voltage (Vpass) may be applied to the select coarse DSG lines (select first DSG line) to turn on the coupled select coarse DSG transistors (select first DSG transistors) in a select set by word line driver 308 of peripheral circuit 102.

At operation 1412, a ground voltage is applied to an additional first DSG line coupled to the first DSG transistors in an additional unselect set of the memory strings that is nonadjacent to the select set of the two adjacent sets of the memory strings. For example, as shown in FIGS. 1-3 and 13, a negative voltage (Vndx) may be applied to unselect DSG lines that are in the unselect sets adjacent to the select set of memory strings to turn off the coupled unselect DSG transistors in the adjacent unselect sets by word line driver 308 of peripheral circuit 102. In contrast, a ground voltage (GND) may be applied to unselect DSG lines that are in the unselect sets not adjacent to the select set of memory strings to turn off the unselect coupled DSG transistors in the nonadjacent unselect sets by word line driver 308 of peripheral circuit 102.

Figure 15:
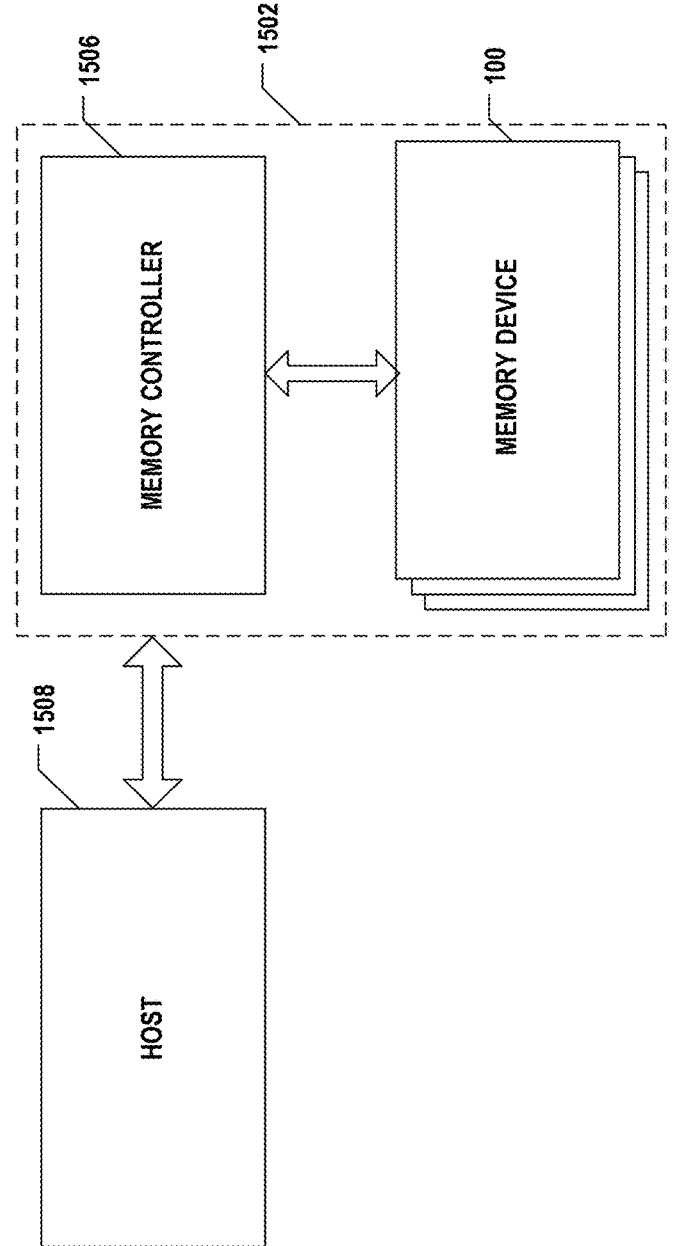
FIG. 15 illustrates a block diagram of a system having a memory device, according to some aspects of the present disclosure.

FIG. 15 illustrates a block diagram of a system 1500 having a memory device, according to some aspects of the present disclosure. System 1500 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 15, system 1500 can include a host 1508 and a memory system 1502 having one or more memory devices 100 (shown in FIG. 1) and a memory controller 1506. Host 1508 can be a processor of an electronic device, such as a central processing unit (CPU), or a system-on-chip (SoC), such as an application processor (AP). Host 1508 can be configured to send or receive data to or from memory devices 100.

Memory device 100 can be any memory device disclosed in the present disclosure. Memory controller 1506 is coupled to memory device 100 and host 1508 and is configured to control memory device 100, according to some implementations. Memory controller 1506 can manage the data stored in memory device 100 and communicate with host 1508. In some implementations, memory controller 1506 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 1506 is designed for operating in a high duty-cycle environment SSDs or embedded multi-media-cards (eMMCs) used as data storage for mobile devices, such as smartphones, tablets, laptop computers, etc., and enterprise storage arrays. Memory controller 1506 can be configured to control operations of memory device 100, such as read, erase, and program operations. Memory controller 1506 can also be configured to manage various functions with respect to the data stored or to be stored in memory device 100 including, but not limited to bad-block management, garbage collection, logical-to-physical address conversion, wear leveling, etc. In some implementations, memory controller 1506 is further configured to process error correction codes (ECCs) with respect to the data read from or written to memory device 100. Any other suitable functions may be performed by memory controller 1506 as well, for example, formatting memory device 100. Memory controller 1506 can communicate with an external device (e.g., host 1508) according to a particular communication protocol. For example, memory controller 1506 may communicate with the external device through at least one of various interface protocols, such as a USB protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 16A:
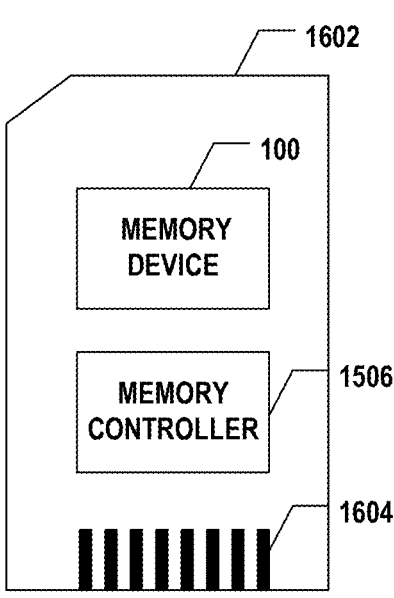
FIG. 16A illustrates a diagram of a memory card having a memory device, according to some aspects of the present disclosure.
Figure 16B:
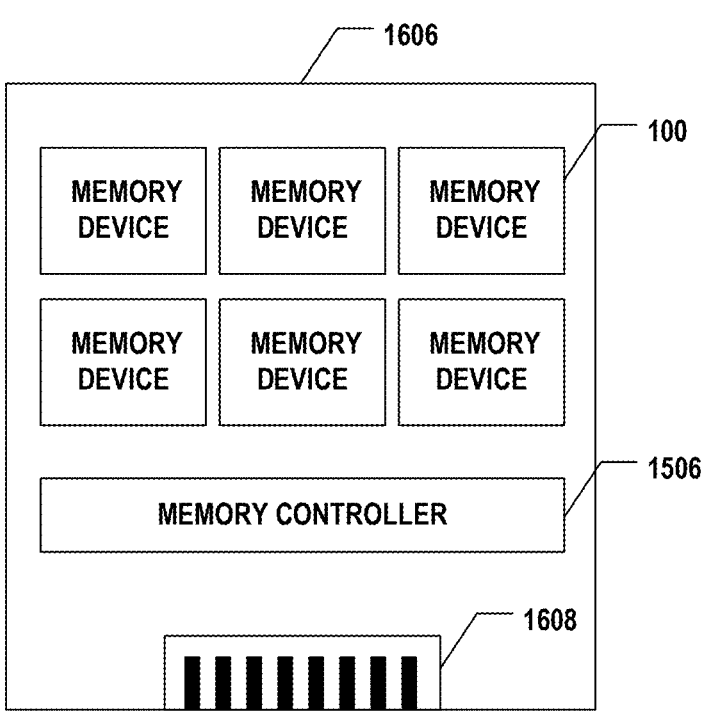
FIG. 16B illustrates a diagram of a solid-state drive (SSD) having a memory device, according to some aspects of the present disclosure.

Memory controller 1506 and one or more memory devices 100 can be integrated into various types of storage devices, for example, being included in the same package, such as a universal Flash storage (UFS) package or an eMMC package. That is, memory system 1502 can be implemented and packaged into different types of end electronic products. In one example as shown in FIG. 16A, memory controller 1506 and a single memory device 100 may be integrated into a memory card 1602. Memory card 1602 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 1602 can further include a memory card connector 1604 coupling memory card 1602 with a host (e.g., host 1508 in FIG. 15). In another example as shown in FIG. 16B, memory controller 1506 and multiple memory devices 100 may be integrated into an SSD 1606. SSD 1606 can further include an SSD connector 1608 coupling SSD 1606 with a host (e.g., host 1508 in FIG. 15). In some implementations, the storage capacity and/or the operation speed of SSD 1606 is greater than those of memory card 1602.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

Although specific configurations and arrangements are discussed, it should be understood that this is done for illustrative purposes only. As such, other configurations and arrangements can be used without departing from the scope of the present disclosure. Also, the subject matter as described in the present disclosure can also be used in a variety of other applications. Functional and structural features as described in the present disclosures can be combined, adjusted, modified, and rearranged with one another and in ways that are consistent with the scope of the present disclosure.

What is claimed is:

1. A memory device, comprising:
memory strings each comprising a first drain select gate (DSG) transistor;
an insulating structure disposed between two adjacent sets of the memory strings and electrically separating the first DSG transistors of the two adjacent sets of the memory strings;
first DSG lines, each of the first DSG lines being coupled to the first DSG transistors in a respective set of the two adjacent sets of the memory strings; and
a peripheral circuit coupled to the memory strings through the first DSG lines and configured to, in an operation, apply a negative voltage to an unselect first DSG line of the first DSG lines, wherein the unselect first DSG line is coupled to the first DSG transistors in an unselect set of the two adjacent sets of the memory strings.

2. The memory device of claim 1, wherein the insulating structure extends laterally in a straight line or a serpentine line, and extends vertically through the first DSG lines.

3. The memory device of claim 1, wherein
each of the memory strings further comprises memory cells, and the memory device further comprises word lines coupled to the memory cells of the memory strings; and
the operation comprises a program operation, and the peripheral circuit is further configured to, in the program operation, during applying the negative voltage to the unselect first DSG line, apply a program voltage to a select word line of the word lines to program select memory cells of the memory cells that are coupled to the select word line.

4. The memory device of claim 2, wherein
each of the memory strings further comprises memory cells, and the memory device further comprises word lines coupled to the memory cells of the memory strings; and
the operation comprises a read operation or a verify operation, and the peripheral circuit is further configured to, in the read or verify operation, during applying the negative voltage to the unselect first DSG line, apply a read/verify voltage to a select word line of the word lines to read or verify select memory cells of the memory cells coupled to the select word line.

5. The memory device of claim 3, wherein
each of the memory strings further comprises a second DSG transistor, and the memory device further comprises a second DSG line coupled to the second DSG transistors of the memory strings; and the peripheral circuit is further configured to, during applying the negative voltage to the unselect first DSG line, apply a first positive voltage to the second DSG line to turn on the second DSG transistors.

6. The memory device of claim 5, wherein
each of the memory strings further comprises a third DSG transistor, and the memory device further comprises a third DSG line coupled to the third DSG transistors of the memory strings, the third DSG line being vertically closer to the insulating structure than the second DSG line; and
the peripheral circuit is further configured to, during applying the negative voltage to the unselect first DSG line, apply a second positive voltage smaller than the first positive voltage to the third DSG line to turn on the third DSG transistors.

7. The memory device of claim 6, wherein the insulating structure extends vertically through the first DSG lines and stops before reaching the second DSG line.

8. The memory device of claim 1, wherein the peripheral circuit is further configured to, in the operation, apply a third positive voltage to a select first DSG line of the first DSG lines, the select first DSG line being coupled to the first DSG transistors in a select set of the two adjacent sets of the memory strings.

9. The memory device of claim 8, further comprising an additional first DSG line coupled to the first DSG transistors in an additional unselect set of the memory strings that is nonadjacent to the select set of the two adjacent sets of the memory strings,
wherein the peripheral circuit is further configured to, in the operation, apply a ground voltage to the additional first DSG line.

10. The memory device of claim 1, wherein the memory device is a NAND Flash memory device.

11. A method for operating a memory device, the memory device comprising memory strings each comprising a first drain select gate (DSG) transistor, an insulating structure disposed between two adjacent sets of the memory strings and electrically separating the first DSG transistors of the two adjacent sets of the memory strings, and first DSG lines each coupled to the first DSG transistors in a respective set of the two adjacent sets of the memory strings, the method comprising:
in an operation, applying a negative voltage to an unselect first DSG line of the first DSG lines, wherein the unselect first DSG line is coupled to the first DSG transistors in an unselect set of the two adjacent sets of the memory strings.

12. The method of claim 11, wherein the insulating structure extends laterally in a straight line or a serpentine line, and extends vertically through the first DSG lines.

13. The method of claim 11, wherein
each of the memory strings further comprises memory cells, and the memory device further comprises word lines coupled to the memory cells of the memory strings; and
the operation comprises a program operation, and the method comprises, in the program operation, during applying the negative voltage to the unselect first DSG line, applying a program voltage to a select word line of the word lines to program select memory cells of the memory cells that are coupled to the select word line.

14. The method of claim 12, wherein each of the memory strings further comprises memory cells, and the memory device further comprises word lines coupled to the memory cells of the memory strings; and the operation comprises a read operation or a verify operation, and the method comprises, in the read or verify operation, during applying the negative voltage to the unselect first DSG line, applying a read/verify voltage to a select word line of the word lines to read or verify select memory cells of the memory cells coupled to the select word line.

15. The method of claim 13, wherein each of the memory strings further comprises a second DSG transistor, and the memory device further comprises a second DSG line coupled to the second DSG transistors of the memory strings; and the method further comprises, during applying the negative voltage to the unselect first DSG line, applying a first positive voltage to the second DSG line to turn on the second DSG transistors.

16. The method of claim 15, wherein each of the memory strings further comprises a third DSG transistor, and the memory device further comprises a third DSG line coupled to the third DSG transistors of the memory strings, the third DSG line being vertically closer to the insulating structure than the second DSG line; and the method further comprises, during applying the negative voltage to the unselect first DSG line, applying a second positive voltage smaller than the first positive voltage to the third DSG line to turn on the third DSG transistors.

17. The method of claim 16, wherein the insulating structure extends vertically through the first DSG lines and stops before reaching the second DSG line.

18. The method of claim 11, further comprising, in the operation, applying a third positive voltage to a select first DSG line of the first DSG lines, the select first DSG line being coupled to the first DSG transistors in a select set of the two adjacent sets of the memory strings.

19. The method of claim 18, wherein the memory device further comprises an additional first DSG line coupled to the first DSG transistors in an additional unselect set of the memory strings that is nonadjacent to the select set of the two adjacent sets of the memory strings; and the method further comprises, in the operation, applying a ground voltage to the additional first DSG line.

20. A system, comprising:

a memory device, comprising:

memory strings each strings comprising a first drain select gate (DSG) transistor;

an insulating structure disposed between two adjacent sets of the memory strings and electrically separating the first DSG transistors of the two adjacent sets of the memory strings;

first DSG lines, each of the first DSG lines being coupled to the first DSG transistors in a respective set of the two adjacent sets of the memory strings; and a peripheral circuit coupled to the memory strings through the first DSG lines and configured to, in an operation, apply a negative voltage to an unselect first DSG line of the first DSG lines, wherein the unselect first DSG line is coupled to the first DSG transistors in an unselect set of the two adjacent sets of the memory strings; and a memory controller coupled to the memory device and configured to control the memory device.

* * * * *